(12) United States Patent
Moon et al.

(10) Patent No.: US 9,992,888 B2
(45) Date of Patent: Jun. 5, 2018

(54) FLEXIBLE DISPLAY ELECTRONIC DEVICE

(71) Applicant: Samsung Electronics Co., Ltd., Suwon-si, Gyeonggi-do (KR)

(72) Inventors: Hee Cheul Moon, Seongnam-si (KR); Gi Dae Kim, Seoul (KR); Moo Hyun Baek, Suwon-si (KR); Chung Keun Yoo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days. days.

(21) Appl. No.: 15/678,692

(22) Filed: Aug. 16, 2017

(65) Prior Publication Data

US 2018/0077810 A1 Mar. 15, 2018

(30) Foreign Application Priority Data

Sep. 13, 2016 (KR) .................. 10-2016-0117854

(51) Int. Cl.
*G06F 1/16* (2006.01)
*H05K 5/02* (2006.01)
*H05K 5/00* (2006.01)

(52) U.S. Cl.
CPC ......... *H05K 5/0226* (2013.01); *G06F 1/1618* (2013.01); *G06F 1/1652* (2013.01); *G06F 1/1681* (2013.01); *H05K 5/0017* (2013.01); *H05K 5/0086* (2013.01)

(58) Field of Classification Search
CPC .... G06F 1/1616; G06F 1/1618; G06F 1/1652; G06F 1/1681
See application file for complete search history.

(56) References Cited

U.S. PATENT DOCUMENTS

| | | | |
|---|---|---|---|
| 9,164,547 B1 | 10/2015 | Kwon et al. | |
| 9,572,272 B2 | 2/2017 | Lee | |
| 9,684,342 B2 | 6/2017 | Kim et al. | |
| 9,811,119 B2 | 11/2017 | Seo | |
| 2005/0122671 A1* | 6/2005 | Homer | G06F 1/1618 361/679.27 |
| 2006/0079277 A1* | 4/2006 | Ditzik | G06F 1/1615 455/556.1 |
| 2007/0117600 A1* | 5/2007 | Robertson, Jr. | H04M 1/0216 455/575.3 |

(Continued)

FOREIGN PATENT DOCUMENTS

| | | |
|---|---|---|
| KR | 10-2010-0082451 A | 7/2010 |
| KR | 10-2014-0101295 A | 8/2014 |

(Continued)

Primary Examiner — Adrian S Wilson
(74) Attorney, Agent, or Firm — Jefferson IP Law, LLP

(57) ABSTRACT

A portable electronic device is provided. The portable electronic device includes a first housing including a first surface and a second surface a second housing including a third surface and a fourth surface, and a hinge. The hinge includes a hinge shaft, a sliding device including a portion configured to slide to an inside or an outside of the second housing to be introduced, or slide from the inside or the outside of the second housing in a specific direction to be extracted in correspondence to a hinge operation of the second housing, and a multi-bar disposed between the first surface and the fourth surface and including multi-bar units to be spread or bent in correspondence to a hinge operation of the second housing.

22 Claims, 19 Drawing Sheets

(56) References Cited

U.S. PATENT DOCUMENTS

| | | | | |
|---|---|---|---|---|
| 2008/0174089 A1* | 7/2008 | Ekberg | ............... | A63C 5/02 280/603 |
| 2010/0182265 A1 | 7/2010 | Kim et al. | | |
| 2010/0232100 A1* | 9/2010 | Fukuma | ............... | F16G 13/18 361/679.01 |
| 2011/0000136 A1* | 1/2011 | Brun | ............... | E05D 3/06 49/358 |
| 2012/0147542 A1* | 6/2012 | Kim | ............... | G06F 1/1601 361/679.28 |
| 2013/0216740 A1* | 8/2013 | Russell-Clarke | ...... | B23K 26/38 428/33 |
| 2013/0219663 A1* | 8/2013 | Cai | ............... | G06F 1/1681 16/371 |
| 2014/0111954 A1* | 4/2014 | Lee | ............... | G06F 1/1641 361/749 |
| 2014/0126133 A1* | 5/2014 | Griffin | ............... | G06F 1/1616 361/679.27 |
| 2014/0174226 A1* | 6/2014 | Hsu | ............... | E05D 3/122 74/98 |
| 2014/0196253 A1* | 7/2014 | Song | ............... | G06F 1/1601 16/225 |
| 2014/0217875 A1* | 8/2014 | Park | ............... | H05K 5/0226 312/326 |
| 2015/0055287 A1 | 2/2015 | Seo | | |
| 2015/0176317 A1* | 6/2015 | Lee | ............... | E05D 3/06 16/251 |
| 2015/0257290 A1 | 9/2015 | Lee | | |
| 2015/0277506 A1* | 10/2015 | Cheah | ............... | G06F 1/1681 361/679.27 |
| 2015/0370287 A1 | 12/2015 | Ko et al. | | |
| 2016/0132075 A1* | 5/2016 | Tazbaz | ............... | G06F 1/1681 361/679.27 |
| 2016/0224072 A1* | 8/2016 | Huang | ............... | E05D 7/06 |
| 2016/0320804 A1* | 11/2016 | Takayanagi | ............ | G06F 1/1615 |
| 2017/0090523 A1* | 3/2017 | Tazbaz | ............... | G06F 1/1681 |

FOREIGN PATENT DOCUMENTS

| | | |
|---|---|---|
| KR | 10-2015-0037383 A | 4/2015 |
| KR | 10-2015-0099676 A | 9/2015 |
| KR | 10-2016-0000109 A | 1/2016 |
| KR | 10-2016-0009726 A | 1/2016 |

* cited by examiner

FLEXIBLE DISPLAY ELECTRONIC DEVICE

CROSS-REFERENCE TO RELATED APPLICATION(S)

This application claims the benefit under 35 U.S.C. § 119(a) of a Korean patent application filed on Sep. 13, 2016 in the Korean Intellectual Property Office and assigned Serial number 10-2016-0117854, the entire disclosure of which is hereby incorporated by reference.

TECHNICAL FIELD

The present disclosure relates to a flexible display device.

BACKGROUND

An electronic device may include a display in relation to the output of a screen. The electronic device may further include a housing surrounding the display.

That is, according to the related art, since the electronic device includes a housing in correspondence to the size of the display, the size of the housing increases as the display becomes larger. Thus, a large screen may be realized when the display is large, but there is a limit to expanding the display as the increase in screen size also results in a reduction in portability.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a flexible display electronic device that may maximize expansion of a display area by employing a flexible display that is foldable.

Another aspect of the present disclosure is to provide a flexible display electronic device that may improve the durability of the electronic device by employing a structure that lowers fatigue in a folding section of a display.

In accordance with an aspect of the present disclosure, a portable electronic device is provided. The portable electronic device may include a first housing including a first surface and a second surface opposite to the first surface, a second housing including a third surface and a fourth surface opposite to the third surface, a hinge including a fifth surface and a sixth surface, the hinge connecting the first housing and the second housing, a flexible display disposed on the first surface, the fifth surface, and the third surface and at least one processor electrically connected to the flexible display and located in at least one of the first housing or the second housing. The hinge is configured to deflect around a hinge shaft extending in a first direction. The hinge shaft extends along a border between the first housing and the second housing when viewed from a top of the first surface. At least a part of the first surface and at least a part of the third surface are disposed in the same direction before the hinge is bent. At least a part of the second surface and at least a part of the fourth surface face each other when the hinge is bent at a specific angle, and the hinge includes a plurality of columns extending in the first direction and disposed on the fifth surface together.

In accordance with another aspect of the present disclosure, a portable electronic device is provided. The portable electronic device includes a first housing including a first surface and a second surface that is opposite to the first surface, a second housing including a third surface and a fourth surface that is opposite to the third surface and a hinge connecting the first housing and the second housing and provided such that the fourth surface is rotated in a direction that faces the first surface. The hinge includes a hinge shaft disposed at a periphery of one side of the first housing, a sliding device including a portion that is configured to slide to an inside or an outside of the second housing to be introduced, or slide from the inside or the outside of the second housing in a specific direction to be extracted in correspondence to a hinge operation of the second housing and a multi-bar disposed between the first surface and the fourth surface and including a plurality of multi-bar units to be spread or bent in correspondence to a hinge operation of the second housing.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
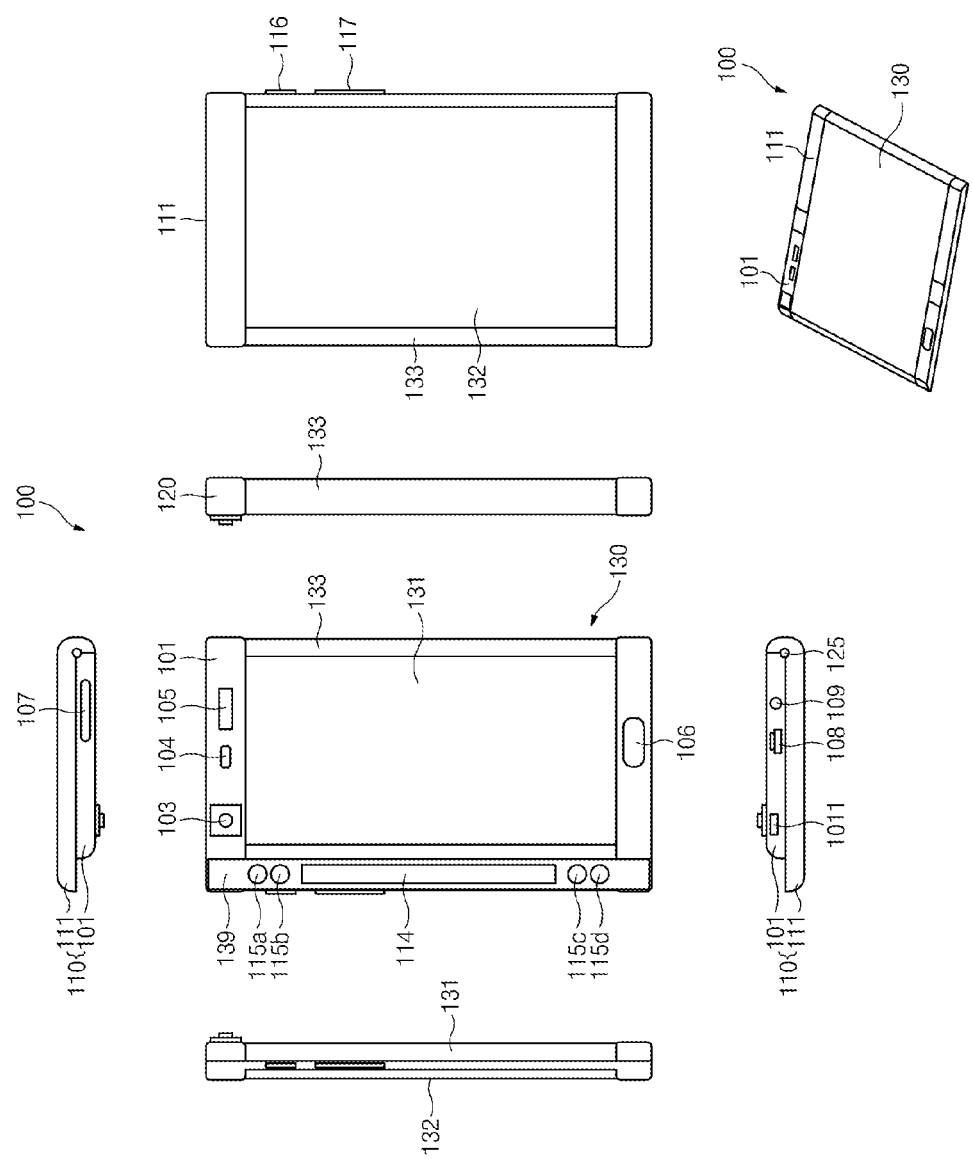
FIG. 1 is a view illustrating an example of an appearance of an electronic device at various angles according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In the disclosure disclosed herein, the expressions "have", "may have", "include" and "comprise", or "may include" and "may comprise" used herein indicate existence of corresponding features (e.g., elements such as numeric values, functions, operations, or components) but do not exclude presence of additional features.

In the disclosure disclosed herein, the expressions "A or B", "at least one of A or/and B", or "one or more of A or/and B", and the like used herein may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used herein may refer to various elements of various embodiments, but do not limit the elements. Furthermore, such terms may be used to distinguish one element from another element. For example, "a first user device" and "a second user device" may indicate different user devices regardless of the order or priority thereof. For example, "a first user device" and "a second user device" indicate different user devices.

It will be understood that when an element (e.g., a first element) is referred to as being "(operatively or communicatively) coupled with/to" or "connected to" another element (e.g., a second element), it may be directly coupled with/to or connected to the other element or an intervening element (e.g., a third element) may be present. In contrast, when an element (e.g., a first element) is referred to as being "directly coupled with/to" or "directly connected to" another element (e.g., a second element), it should be understood that there is no intervening element (e.g., a third element).

According to the situation, the expression "configured to" used herein may be used as, for example, the expression "suitable for", "having the capacity to", "designed to", "adapted to", "made to", or "capable of". The term "configured to" must not mean only "specifically designed to" in hardware. Instead, the expression "a device configured to" may mean that the device is "capable of" operating together with another device or other components. central processing unit (CPU), for example, a "processor configured to perform A, B, and C" may mean a dedicated processor (e.g., an embedded processor) for performing a corresponding operation or a generic-purpose processor (e.g., a CPU or an application processor) which may perform corresponding operations by executing one or more software programs which are stored in a memory device.

Terms used in the present disclosure are used to describe specified embodiments and are not intended to limit the scope of the present disclosure. The terms of a singular form may include plural forms unless otherwise specified. Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal detect unless expressly so defined herein in various embodiments of the present disclosure. In some cases, even if terms are terms which are defined in the specification, they may not be interpreted to exclude embodiments of the present disclosure.

An electronic device according to various embodiments of the present disclosure may include at least one of smartphones, tablet personal computers (PCs), mobile phones, video telephones, e-book readers, desktop PCs, laptop PCs, netbook computers, workstations, servers, personal digital assistants (PDAs), portable multimedia players (PMPs), motion picture experts group (MPEG-1 or MPEG-2) audio layer 3 (MP3) players, mobile medical devices, cameras, wearable devices (e.g., head-mounted-devices (HMDs), such as electronic glasses), an electronic apparel, electronic bracelets, electronic necklaces, electronic appcessories, electronic tattoos, smart watches, and the like.

According to another embodiment, the electronic devices may be home appliances. The home appliances may include at least one of, for example, televisions (TVs), digital versatile disc (DVD) players, audios, refrigerators, air conditioners, cleaners, ovens, microwave ovens, washing machines, air cleaners, set-top boxes, home automation control panels, security control panels, TV boxes (e.g., Samsung HomeSync™, Apple TV™, or Google TV™), game consoles (e.g., Xbox™ or Play Station™), electronic dictionaries, electronic keys, camcorders, electronic picture frames, or the like.

According to another embodiment, the photographing apparatus may include at least one of medical devices (e.g., various portable medical measurement devices (e.g., a blood glucose monitoring device, a heartbeat measuring device, a blood pressure measuring device, a body temperature measuring device, and the like)), a magnetic resonance angiography (MRA), a magnetic resonance imaging (MRI), a computed tomography (CT), scanners, and ultrasonic devices), navigation devices, global positioning system (GPS) receivers, event data recorders (EDRs), flight data recorders (FDRs), vehicle infotainment devices, electronic equipment for vessels (e.g., navigation systems and gyrocompasses), avionics, security devices, head units for vehicles, industrial or home robots, automatic teller's machines (ATMs), points of sales (POSs), or internet of things (e.g., light bulbs, various sensors, electric or gas meters, sprinkler devices, fire alarms, thermostats, street lamps, toasters, exercise equipment, hot water tanks, heaters, boilers, and the like).

According to another embodiment, the electronic devices may include at least one of parts of furniture or buildings/structures, electronic boards, electronic signature receiving devices, projectors, or various measuring instruments (e.g., water meters, electricity meters, gas meters, or wave meters, and the like). In the various embodiments, the electronic device may be one of the above-described various devices or a combination thereof. An electronic device according to an embodiment may be a flexible device. Furthermore, an electronic device according to an embodiment may not be limited to the above-described electronic devices and may include other electronic devices and new electronic devices according to the development of technologies.

Hereinafter, an electronic device according to the various embodiments may be described with reference to the accompanying drawings. The term "user" used herein may refer to a person who uses an electronic device or may refer to a device (e.g., an artificial intelligence electronic device) that uses an electronic device.

FIG. 1 is a view illustrating an example of an appearance of an electronic device at various angles according to an embodiment of the present disclosure.

Figure 2:
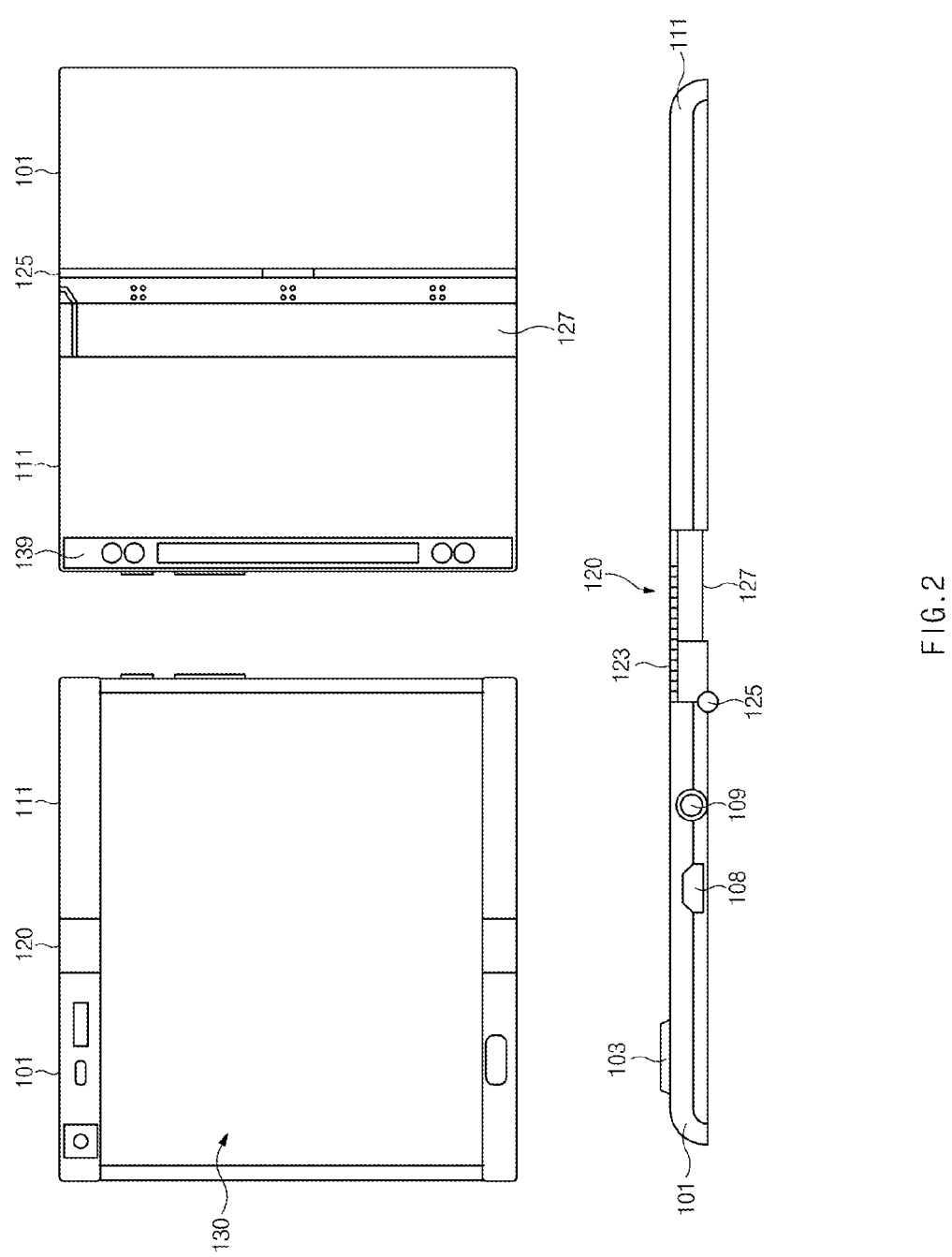
FIG. 2 is a view illustrating an example of external appearances of front and rear surfaces of an electronic device according to an embodiment of the present disclosure.

FIG. 2 is a view illustrating an example of external appearances of front and rear surfaces of an electronic device according to an embodiment of the present disclosure.

Referring to FIGS. 1 and 2, the electronic device 100 may schematically include a display 130 (e.g., a flexible display), a housing 110, and a hinge unit 120 (e.g., a hinge or a hinge part).

The display 130 may include a flexible display, at least a portion of which is deflected (bent). In this regard, the display 130 may include at least one pixel that may be deflected and signal lines. The display 130 may include a first display area 131, a second display area 132, and a hinge display area 133. The first display area 131, the hinge display area 133, and the second display area 132 may be connected to each other to form one entity. For example, one side of the first display area 131 may be connected to one side of the hinge display area 133, and an opposite side of the hinge display area 133 may be connected to one side of the second display area 132.

The first display area 131 may be disposed on a front surface of the display 130 or the second display area 132 may be disposed on a front surface of the display 130 according to a direction in which the display 130 is positioned. For example, when the electronic device 100 is in a first state (e.g., the display 130 is folded to be observed from the outside), the first display area 131 and the second display area 132 may be disposed in directions that is opposite to each other. In the first state, the hinge display area 133 may be observed from a side direction while being disposed between the first display area 131 and the second display area 132. While the display 130 is in a second state (e.g., a state in which the housing 110 is unfolded), the first display area 131, the hinge display area 133, and the second display area 132 may face the same direction with respect to the horizontal direction. According to various embodiments, when the electronic device 100 is in a third state (e.g., a state in which the housing 110 is bent at a specific angle), the first display area 131 and the second display area 132 may face directions of different angles with respect to the horizontal direction. The size of the first display area 131 and the size of the second display area 132 may be the same or different. Although the drawing illustrates a form in which the size of the first display area 131 disposed in the first direction is smaller than the size of the second display area 132 disposed in the second direction (e.g., a direction that is opposite to the first direction) in the first state, the present disclosure is not limited thereto. For example, the first display area 131 and the second display area 132 may have the same size.

The housing 110 may surround a periphery of the display 130 such that at least a partial area of the display 130 may be observed from the outside. Various device elements (e.g., a driving circuit related to the display 130, an application processor, a printed circuit board, and a battery) related to driving of the display 130 may be embedded inside the housing 110. Various elements related to a user function may be disposed on at least one side of the housing 110. The housing 110 may include a first housing 101 and a second housing 111 in correspondence to an area in which the display 130 is disposed. According to various embodiments, various device elements (e.g., a driving circuit related to driving of the display 130, an application processor, a printed circuit board, and a battery) related to driving of the display 130 may be disposed in at least one of the first housing 101 and the second housing 111.

The first housing 101 may include a first surface and a second surface that is opposite to the first surface, and may include three side surfaces disposed between the first surface and the second surface. One side surface of the hinge unit 120 may be disposed on one surface between the first surface and the second surface. A first display area of the display 130 for example, may be disposed on the first surface. The second housing 111 may include a third surface and a fourth surface that is opposite to the third surface, and may include three side surfaces disposed between the third surface and the fourth surface. An opposite side surface of the hinge unit 120 may be disposed on one surface between the third surface and the fourth surface. According to the state of the electronic device 100, the surfaces may have various disposition states. For example, in an unfolded state of the electronic device 100, the first surface and the third surface or the second surface and the fourth surface may be disposed in the same direction. In a folded state of the electronic device 100, the first surface and the third surface are opposite to each other and the second surface and the fourth surface may face each other. The above-described electronic device 100 may be folded in an acute angle direction in which the second surface and the fourth surface face each other, and may be rotated to a parallel state (e.g., 180 degrees).

The first display area 131 of the display 130 may be disposed over an overall central portion of the housing 101. For example, a camera 103, a receiver 104, a sensor 105, and a home button 106 may be disposed in an area (e.g., a front area of an upper end or a front area of a lower end of the first display area 131) other than the first display area 131 of the first housing 101. A connector 107 may be disposed in one side surface area (e.g., an upper end side surface area or a lower end side surface area) of the first housing 101. Further, a speaker hole 101l, a hold button 108, and an earphone connector 109 may be disposed in an opposite side surface area (e.g., a lower end side surface area) of the first housing 101. The first housing 101 may be connected to the second housing 111 through the hinge unit 120.

The second display area 132 is disposed in the second housing 111, and the second housing 111 may surround a periphery of the second display area 132. At least some of the device elements related to driving of the display 130, for example, may be included inside the second housing 111. As illustrated, when the second display area 132 is larger than the first display area 131, in the first state, one side of a rear surface of the second housing 111 may be exposed in a direction of the first display area 131. An auxiliary display 139, for example, may be disposed on one side of a rear surface (e.g., one side of a periphery) of the second housing 111. An area of the auxiliary display 139 may include one or more virtual key buttons 114, 115a, 115b, 115c, and 115d. For example, a power button 116 or a volume button 117 may be disposed in a side surface area of the second housing 111. The power button 116 or the volume button 117, for example, may be disposed in a side surface area of the first housing 101.

The hinge unit 120, for example, may include a hinge shaft 125, a sliding unit 127, and a multi-bar 123. The hinge shaft 125 may fix the first housing 101 and the sliding unit 127 in a hinge manner. The hinge shaft 125 may support a hinge operation of the sliding unit 127 and the second housing 111 connected to the sliding unit 127 such that the sliding unit 127 is in a rotated state at a specific angle (e.g., 0 to 180 degrees) with respect to the first housing 101. The hinge shaft 125 may extend along a border between the first housing 101 and the second housing 111.

The above-described hinge unit 120 may include a fifth surface and a sixth surface. The multi-bar 123 may be disposed on the fifth surface. At least a portion of the fifth surface may be curved or flat according to a hinge operation of the electronic device 100. The fifth surface may be disposed between the first surface and the third surface. According to an embodiment, the fifth surface may connect the first surface and the third surface. At least a portion of the display 130 may be disposed on the fifth surface. The sliding unit 127 may be disposed on the sixth surface, and at least a portion of the sliding unit 127 may be inserted in to the second housing 111 or may be extracted from the second housing 111 according to a hinge state of the electronic device 100. According to various embodiments, the sliding unit 127 may be disposed in a form in which at least a portion of the sliding unit 127 is moved to the outside of the second housing 111 and then at least a portion of the sliding unit 127 is extracted from the outside of the second housing 111. The sixth surface may be disposed between the second surface and the fourth surface.

The multi-bar 123 may be disposed under the hinge display area 133 of the rear surface of the display 130. The multi-bar 123 may be continuously arranged in a flat form by an external force or may be bent at a specific angle. The sliding unit 127 may be slid into the second housing 111 or be exposed to the outside according to a folded state of the electronic device 100. For example, when the electronic device 100 is in the first state (e.g., a folded state), the sliding unit 127 may maintain a state in which the sliding unit 127 is inserted into the second housing 111. When the electronic device 100 is in the second state (e.g., an unfolded state), an area of the sliding unit 127 inserted into the second housing 111 may be minimized. When the electronic device 100 is in a third state (e.g., a state having a specific angle, for example, more than 0 to less than 180 degrees), a partial area of the sliding unit 127 may be inserted into the second housing 111.

Figure 3:
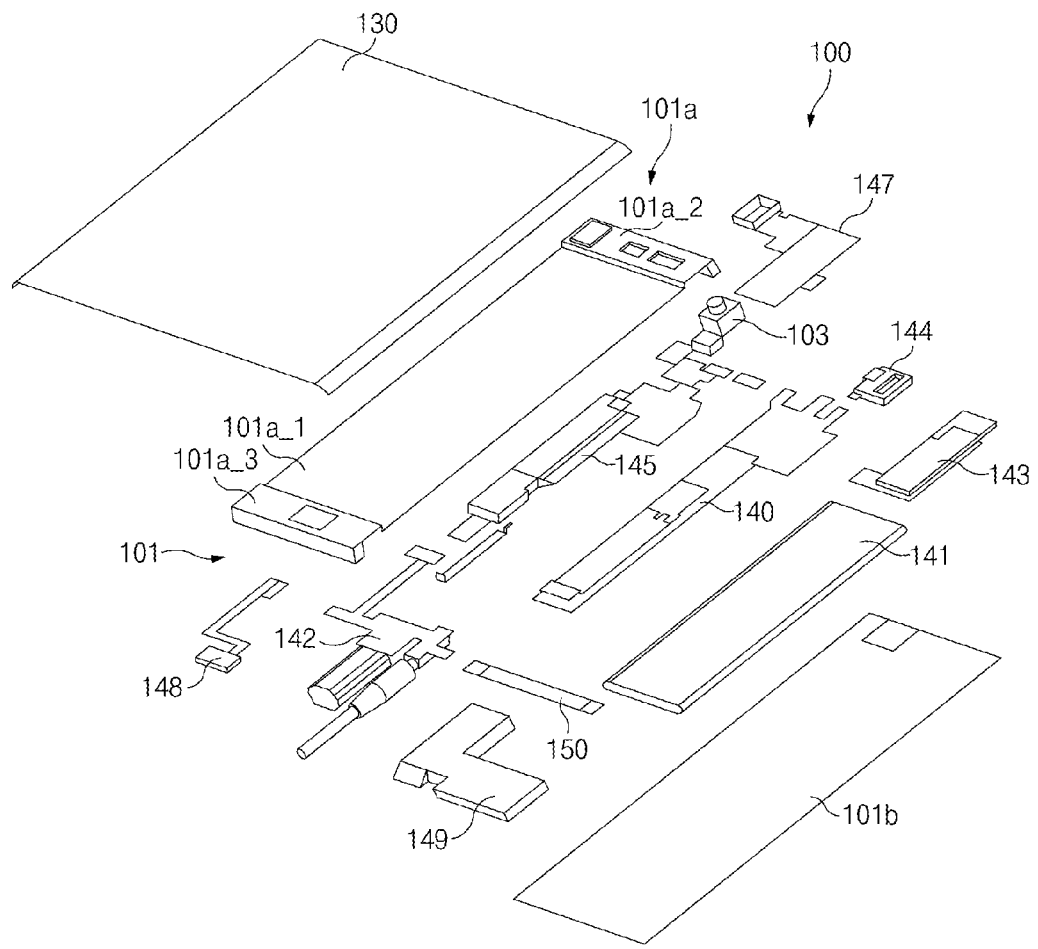
FIG. 3 is a view schematically illustrating a first housing and a display of an electronic device according to an embodiment of the present disclosure.

FIG. 3 is a view schematically illustrating a first housing and a display of an electronic device according to an embodiment of the present disclosure.

Referring to FIG. 3, the first housing 101 of the present disclosure may include a right side upper end cover 101a and a right side rear surface case 101, and at least one of device elements, for example, a camera 103, a camera bracket 147, a receiver 144, an subscriber identification module (SIM) printed circuit board (PCB) 143, a battery 141, a main PCB 140, a shield can 145, a battery 141, a battery connection line 150, a connector case 149, a first sub PCB 142, a home button 148, and a battery connection line 150 may be embedded in the first housing 101. At least a portion of at least one of the device elements embedded in the first housing 101 may be exposed to the outside. For example, at least a portion of the camera 103, the receiver 144, the connector case 149, and the home button 148 may be exposed through a hole provided in the right side upper end cover 101a.

The camera bracket 147 may include a deck in which the camera 103 may be seated, and an image sensor configured to supply a signal to the camera 103 and store a signal acquired by the camera 103. The receiver 144 may output a communication connection sound or a communication sound of the electronic device 100. The SIM PCB 143 may include an SIM card, and may include a driving circuit related to reading and writing of the SIM card. The SIM PCB 143 may be electrically connected to the main PCB 140, and may provide SIM information in correspondence to control of an application process (or a processor) disposed in the main PCB 140. The battery 141 may supply electric power related to an operation of the electronic device 100. The battery 141 may be connected to a first sub PCB 142 through the battery connection line 150, and may be charged by receiving electric power from a charger connected to the outside through the connector case 149. The battery connection line 150, for example, may be formed of a field programmable circuit board (or Flexible printed circuit board) (FPCB). The battery connection line 150 may connect the battery 141 and the first sub PCB 142. The first sub PCB 142 may be seated on one side of the connector case 149. A speaker and a microphone may be connected to the first sub PCB 142. The first sub PCB 142 may be connected to the main PCB 140 to transmit and receive a signal related to the speaker and the microphone. One side of the home button 148 may be exposed through a hole provided in the right side upper end cover 101a. The home button 148 may be electrically connected to the first sub PCB 142 or may be directly connected to the main PCB 140.

The right side upper end cover 101*a*, for example, may include a first seating part 101*a*_1 in which the first display area 131 of the display 130 may be disposed, a right side upper end area 101*a*_2 disposed at an upper end of the first seating part 101*a*_1, and a right side lower end area 101*a*_3 disposed at a lower end of the first seating part 101*a*_1. The camera 103, the receiver 144, and the like may be disposed in the right side upper end area 101*a*_2 of the right side upper end cover 101*a*. The home button 148, the connector case 149, and the like may be disposed in the right side lower end area 101*a*_3 of the right side upper end cover 101*a*. The above-described device elements disposed inside the first housing 101 is exemplary, and may be changed in correspondence of a design intention of the electronic device 100. For example, although it is illustrated that the home button 148 has a form of a physical button, it may be replaced by a touch pad type. Further, the camera 103 and the camera bracket 147 may be removed from the device elements.

Figure 4:
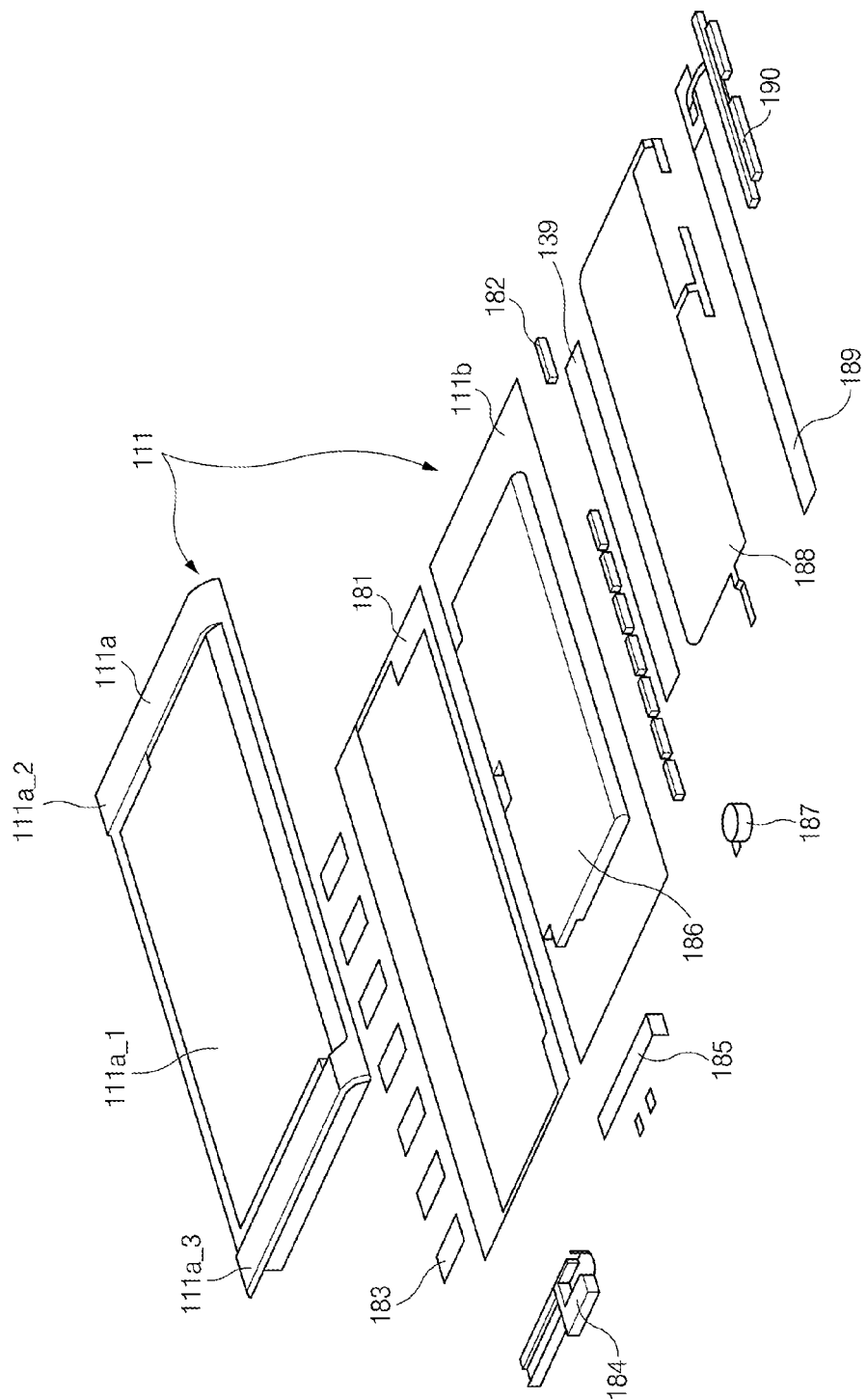
FIG. 4 is a view illustrating an example of a second housing according to an embodiment of the present disclosure.

FIG. 4 is a view illustrating an example of a second housing according to an embodiment of the present disclosure.

Referring to FIG. 4, the second housing 111 of the present disclosure may include a left side upper end cover 111*a* and a left side rear surface case 111*b*. The second housing 111 may include a slide sheet 183, a bottom case 184, a bonding member 181, an auxiliary battery 186, first magnet members 182, an auxiliary display 139, a slide sheet 183, a side button 190 (e.g., the power button 116 or the volume button 117), and a slider 185. Further, the second housing 111 may include a vibration module 187, antenna sheet 188, and a second sub PCB 189 electrically connected to the side button 190 and the auxiliary display 139 and configured to process a signal related to operations of the side button 190 and the auxiliary display 139.

The left side upper end cover 111*a*, for example, may include a second seating part 111*a*_1 in which one surface of the display may be disposed, and a left side upper end area 111*a*_2 and a left side lower end area 111*a*_3 disposed at an upper end and a lower end of the second seating part 111*a*_1, respectively. The second seating part 111*a*_1, for example, may include a flat area in which a central part of the second display area 132 is disposed, and a curved area in which a peripheral area of the second display area 132 is disposed. The display 130 may move to a partial area disposed in the curved area in correspondence to the bending of the electronic device 100. For example, when the electronic device 100 is the first state (e.g., a folded state), the display 130 may move from a periphery of the curved area of the second seating part 111*a*_1 toward a flat area by a specific length. When the electronic device 100 is the second state (e.g., an unfolded state), the display 130 may move toward a periphery of the curved area of the second seating part 111*a*_1. At least a portion of the interiors of the left side upper end area 111*a*_2 and the left side lower end area 111*a*_3, for example, may be empty such that the second housing 111 moves in a specific direction with respect to the hinge unit 120. The hinge unit 120 may be provided inside the left side upper end area 111*a*_2 and the left side lower end area 111*a*_3, and rail supports 164 configured to support sliding of the second housing 111 may be moved.

The slide sheet 183 may reduce a frictional force that may be repeatedly generated while the second housing 111 is slid while improving a sliding function of the second housing 111. The slide sheet 183, for example, may be formed of a material, a frictional coefficient of at least a portion of a surface of which is relatively low (or not more than a specific value). The bottom case 184 may be disposed inside the left side lower end area 111*a*_3 (or the left side upper end area 111*a*_2), and may guide a rail support 164 of the hinge unit 120. The bonding member 181 may bond the left side upper end cover 111*a* and the left side rear surface case 111*b*. The bonding member 181 may bond a peripheral part of the left side upper end cover 111*a* and a peripheral part of the left side rear surface case 111*b*. The auxiliary battery 186 may supply electric power of the electronic device 100. The auxiliary battery 186 may be charged in correspondence to control of a processor or be charged in parallel (or together with or simultaneously with) the battery 141 after the battery 141 disposed in the first housing 101 is completely charged. The first magnet member 182 may be used to maintain the first state (e.g., a folded state) of the electronic device 100. The auxiliary display 139 may be disposed at a periphery (e.g., under a curved area) of the left side upper end cover 111*a*, and may output information in correspondence of control to the processor. According to various embodiments, the auxiliary display 139 may include a touch screen function, and may be used as an input unit based on the touch screen function.

The antenna sheet 188, for example, may perform wireless charging or a near field communication (NFC) function. In this regard, at least one of a wireless charging antenna or an NFC antenna, a charging circuit, and an NFC control integrated circuit (IC) may be disposed in the antenna sheet 188. The side button 190, for example, may include a volume key or a power key. The vibration module 187 (e.g., the vibration motor) may generate vibration of a specific pattern in correspondence to control of the processor. The second sub PCB 189 may perform signal processing related to control of the auxiliary display 139. Further, the second sub PCB 189 may process a user input by pressing of the side button 190 or may deliver the received user input to the main PCB 140. The slider 185 may be coupled to a constraint part of the rail support disposed in the hinge unit 120, and may fix the constraint part in the interior of the left side upper end area 111*a*_2 or the left side lower end area 111*a*_3 that performs sliding of the second housing 111. Accordingly, while the constraint part of the hinge unit 120 moves in the rail support, a sliding operation in which the second housing 111 becomes far away from or closer to the hinge unit 120 may be performed. Meanwhile, as an example, at least some of the above-described device elements included in the second housing 111 may be omitted or various other elements may be disposed in the second housing 111.

Figure 5:
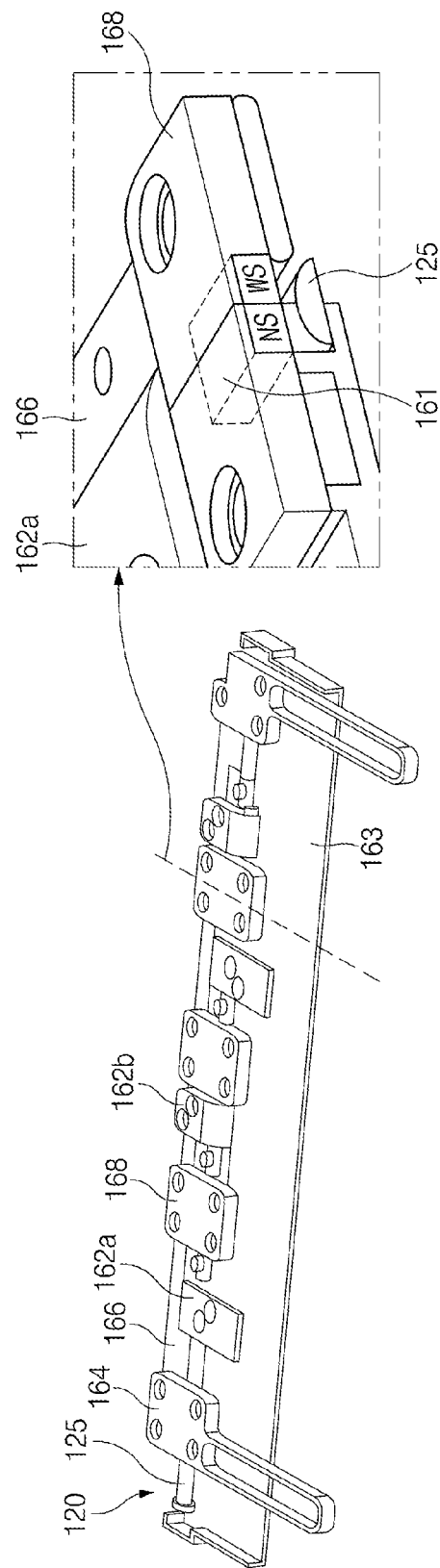
FIG. 5 is a view illustrating an example of a hinge unit according to an embodiment of the present disclosure.

FIG. 5 is a view illustrating an example of a hinge unit according to an embodiment of the present disclosure.

Figure 6:
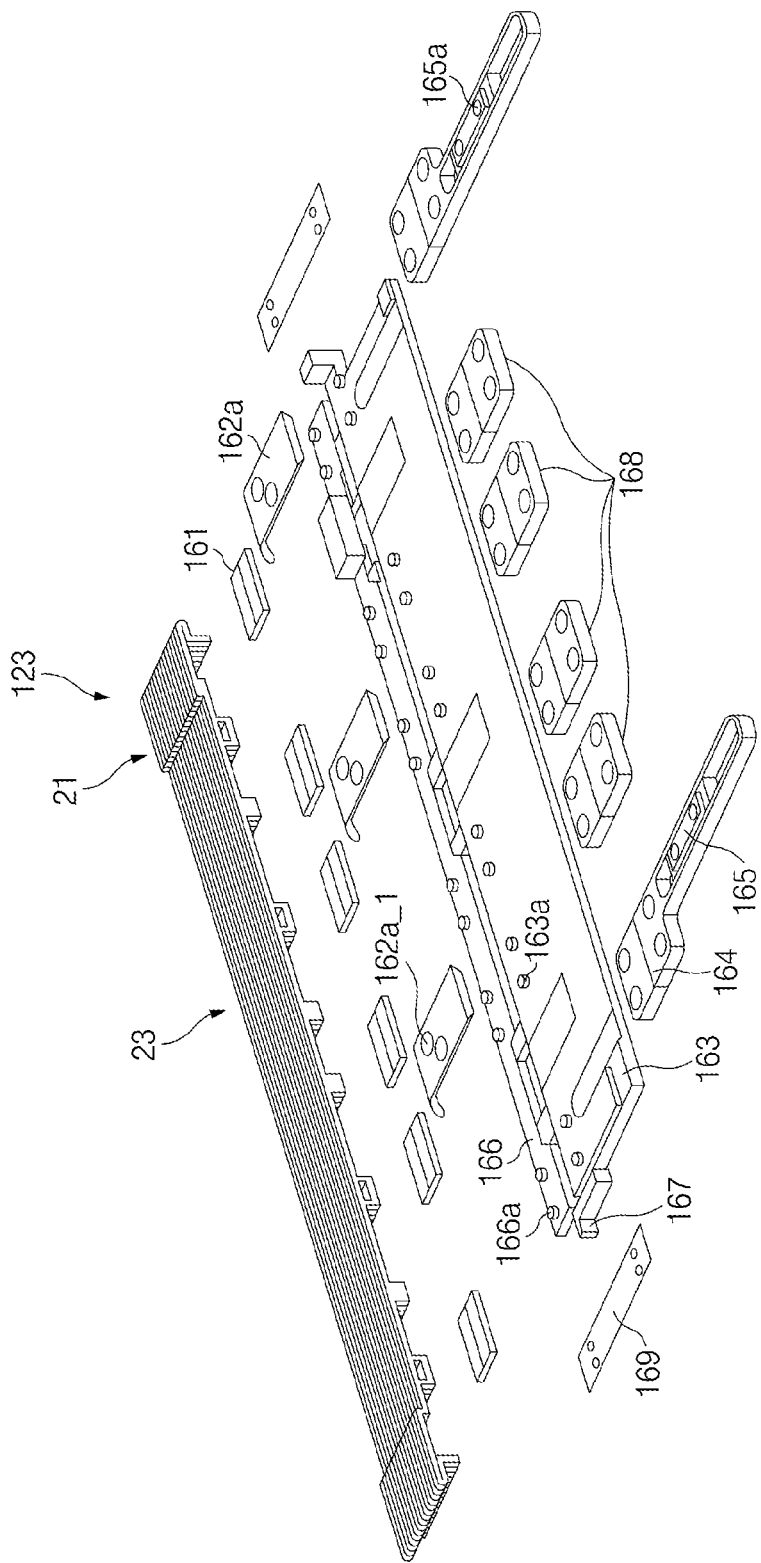
FIG. 6 is an example of an exploded perspective view of a hinge unit according to an embodiment of the present disclosure.

FIG. 6 is an example of an exploded perspective view of a hinge unit according to an embodiment of the present disclosure.

Figure 7:
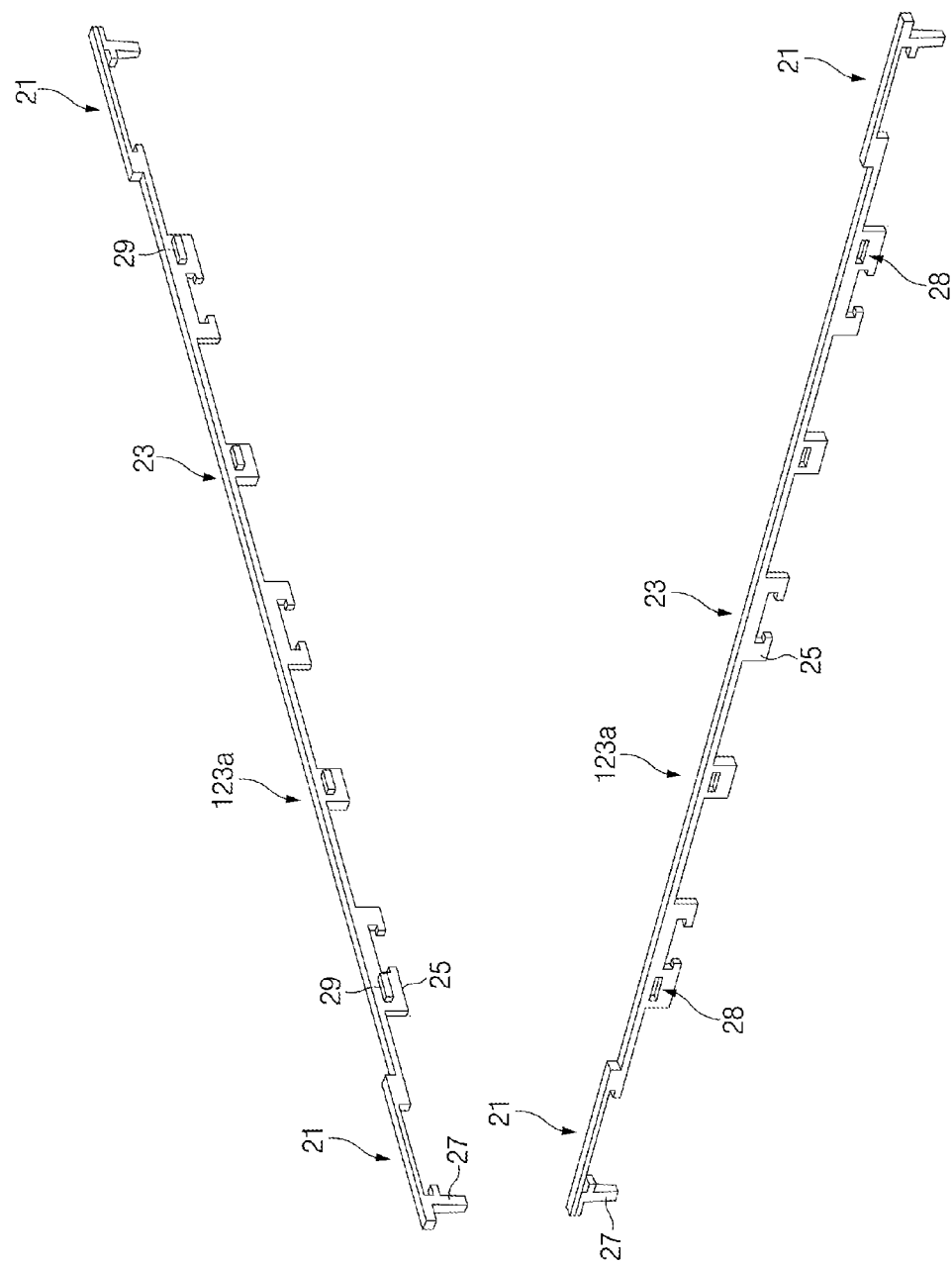
FIG. 7 is a view illustrating an example of front and rear surfaces of a multi-bar according to an embodiment of the present disclosure.

FIG. 7 is a view illustrating an example of front and rear surfaces of a multi-bar according to an embodiment of the present disclosure.

Figure 8:
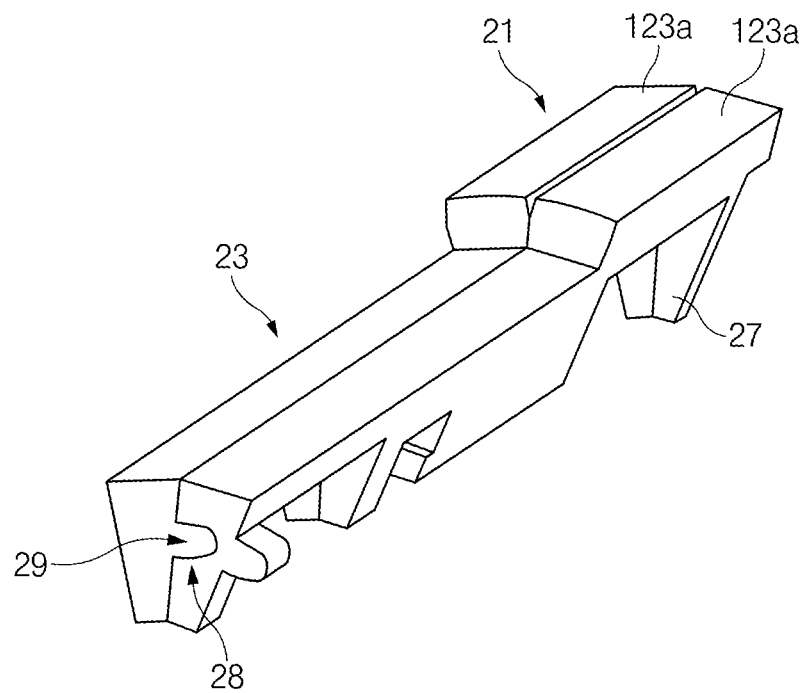
FIG. 8 is a view illustrating an example of a partial area of a multi-bar according to an embodiment of the present disclosure.

FIG. 8 is a view illustrating a partial area of a multi-bar according to an embodiment of the present disclosure.

Figure 9:
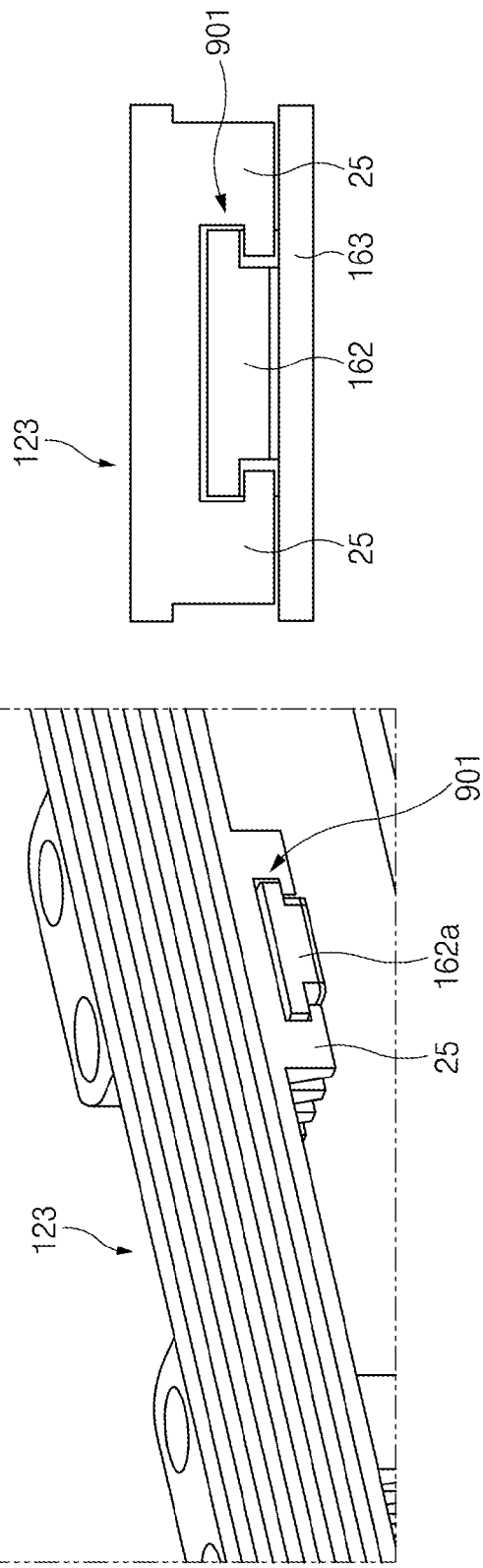
FIG. 9 is a view illustrating a coupled state of a multi-bar and a hinge bracket according to an embodiment of the present disclosure.

FIG. 9 is a view illustrating a coupled state of a multi-bar and a hinge bracket according to an embodiment of the present disclosure.

Figure 10:
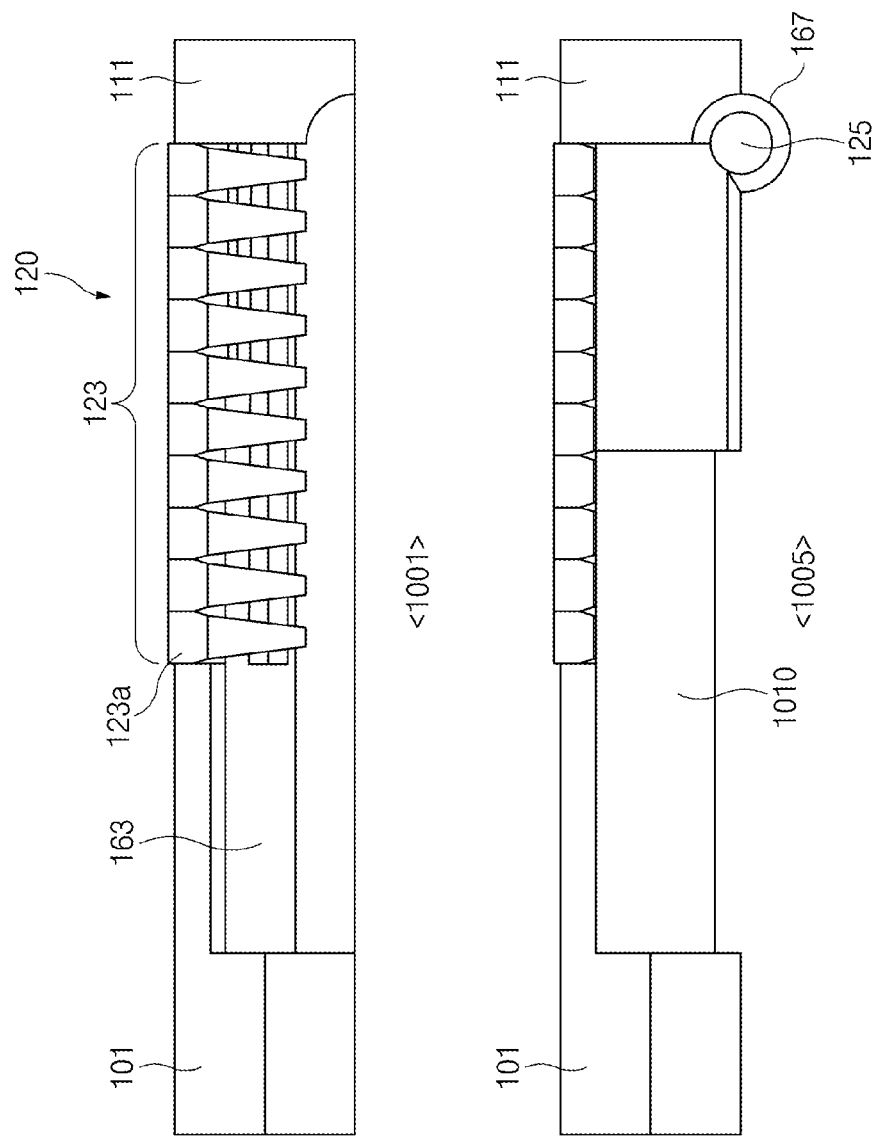
FIG. 10 is a view illustrating an example of a portion of a side surface of an electronic device according to an embodiment of the present disclosure.

FIG. 10 is a view illustrating an example of a portion of a side surface of an electronic device according to an embodiment of the present disclosure.

Referring to FIGS. 5 and 6, the hinge unit 120 of the present disclosure may include at least one of a multi-bar 123, second magnet members 161, magnet support members 168, a plate 166, a support cover 163, rail supports 164, a constraint part 165, a hinge bracket 162a, a rotation guide 162b, and a support plate 169. The hinge unit 120 having the structure may be designed such that the center of the hinge unit 120 is branched (or at least a portion of the hinge unit 120 is separated). For example, a pair of magnet support members 168 may be provided with respect to contacting surfaces thereof, and one of the pair of magnet support members 168 may be fixed to the plate 166 and the other of the pair of magnet support members 168 may be fixed to the support cover 163. The pair of second magnet members 161 may be disposed inside the magnet support members 168, respectively. Accordingly, one of the second magnet members 161 may be disposed on one side of the magnet support members 168, and the other of the second magnet members 161 may be disposed on an opposite side of the magnet support members 168. Accordingly, when the electronic device 100 is in the first state (e.g., the folded state), the magnet support members 168 and the second magnet members 161 may be spaced apart from each other to be disposed vertically in parallel to each other. When the electronic device 100 is in the second state (e.g., an unfolded state), the magnet support members 168 and the second magnet members 161 may be coupled to each other through a magnetic force while facing each other.

The second magnet members 161, for example, may include a plurality of magnets that form pairs. Further, the second magnet members 161 may form pairs, and at least first ones of the second magnet members 161 includes a magnet and the other ones of the second magnet members 161 may include a magnetic body reacting a magnetic force of the magnet. The pairs of second magnet members 161 may be disposed in the magnet support members 168 that form pairs. Although it is illustrated that the second magnet members 161, for example, has a bar shape, the present disclosure is not limited thereto. For example, the second magnet members 161 may have a shape such as a cylindrical shape or a polygonal shape.

At least corresponding surfaces of the magnet support members 168 contact each other. The second magnet members 161 may be fixed to at least corresponding sides of the magnet support members 168. According to an embodiment, first ones of the second magnet members 161 is inserted into first ones of the magnet support members 168 that form pairs, and surfaces of the second magnet members 161 may be exposed to the outside. The other ones of the magnet support members 168 that form pairs also may be inserted into the other ones of the second magnet members 161, and surfaces of the inserted second magnet members 161 may be exposed to face the other ones. The magnet support members 168 that form pairs may be fixed to the plate 166 and the support cover 163, respectively, and the facing surfaces of the magnet support members 168 may contact each other or be spaced apart from each other in correspondence to spacing or arrangement of the plate 166 and the support cover 163. As the pair of magnet support members 168 are separated or integrated, the pairs of the second magnet members 161 fixed to one side of the magnet support members 168 may be separated or be coupled to each other (or maintain a contact state) based on a magnetic force.

The plate 166 may be disposed axially while having a specific length (e.g., a length that is the same as or similar to a longitudinal length of the electronic device 100). At least one first connector 166a (e.g., a boss having a female screw thread) may be disposed on a surface of the plate 166. First ones of the magnetic support members 168 that form pairs may be fixed to the first connector 166a disposed in the plate 166, and first ones of the second magnet members 161 that form pairs may be fixed to the magnet support members 168. Additionally, at least one hinge bracket 162a (e.g., some hinge brackets 162a) may be fixed to one side of the plate 166. The plate 166 may be disposed in parallel to the support cover 163.

The support cover 163 may have a specific axial length (e.g., a length that is substantially the same as that of the plate 166) and a specific width (e.g., a specific width that is larger than that of the plate 166). At least one second connector 163a (e.g., a boss having a female screw thread) may be disposed on one side of the support cover 163 (e.g., an area that is adjacent to the plate 166 when the plate 166 is disposed in parallel). The second connector 163a disposed in the support cover 163 may be disposed to be aligned with the first connector 166a disposed in the plate 166. First ones of the magnet support members 168 that form pairs (to which first ones of the second magnet members 161 that form pairs are fixed) may be fixed to an upper side of the support cover 163. According to various embodiments, the rail supports 164 may be fixed to one side of the support cover 163. The support plate 169 may be disposed between the support cover 163 and the rail supports 164. When the electronic device 100 is in a second state (e.g., an unfolded state), the support cover 163 may be disposed in parallel to the plate 166. Further, when the electronic device 100 is in a first state (e.g., a folded state), the support cover 163 may be aligned with the plate 166 vertically. The support cover 163 may include a seating groove 167 in which the hinge shaft 125 may be seated, at a periphery of one side of the support cover 163. For example, the seating groove 167 may extend in a longitudinal direction of the support cover 163. The hinge shaft 125 inserted into the seating groove 167, for example, may be rotated in the seating groove 167 by magnet support members and a hinge bracket.

The rail supports 164 may be disposed on one side (e.g., an upper end side and a lower end side) of the support cover 163. Some of the rail supports 164 may have shapes that are similar to those of the magnet support members 168, and the others of the rail supports may have a ring shape one axis of which is relatively longer than the other axis thereof. The ring may be disposed in a direction of the second housing 111. The constraint part 165 may be disposed on one side (e.g., an inside of the ring) of the rail supports 164.

The constraint part 165, for example, may have an elliptical shape, one axis of which is longer than another axis thereof, or a rectangular shape, a corner of which is rounded. The constraint part 165 may be disposed inside the rings of the rail supports 164. Then, the constraint part 165 may move in one direction (e.g., a long axis direction of the ring) inside the rail supports 164. The constraint part 165, for example may be fixed to one side of the second housing 111. Accordingly, as the second housing 111 moves while the electronic device 100 is in the first state or in the second state, the constraint part 165 may move to leftwards and rightwards (or forwards and rearwards) inside the rain supports 164. The constraint part 165 may include at least one third connector 165a (e.g., a hole having a female screw thread) for coupling with the second housing 111.

The hinge bracket 162a may have a rectangular shape, and one end of the hinge bracket 162a may be bent and the remaining areas of the hinge bracket 162a may be flat. At least one fourth connector 162a_1 (e.g., a hole having a female screw thread), which is to be coupled to the plate 166 or the support cover 163 may be disposed on one side of the hinge bracket 162a. A plurality of hinge brackets 162a may be provided. Some of the plurality of hinge brackets 162a may be coupled to the plate 166, and the remaining ones thereof may be coupled to the support cover 163. The hinge brackets 162a may function to fix the multi-bar 123 while the electronic device 100 is in the first state or the second state. In this regard, the hinge brackets 162a may be inserted into recesses formed in the multi-bar 123.

The rotation guide 162b may include a flat area, and a curved area extending from the flat area. The flat area may include at least one fixing hole that may fix the rotation guide 162b to the plate 166. A section of an end of the curved area of the rotation guide 162b may face a front surface of the support cover 163 while the electronic device 100 is unfolded state. The above-described rotation guide 162b may support rotation of the multi-bar 123 while the state of the electronic device 100 is changed to a bent state (e.g., a state in which the first housing 101 and the second housing 111 form a specific angle, for example, 30 degrees, 60 degrees, 90 degrees, or 120 degrees) or a folded state (a state in which the first housing 101 and the second housing 111 are disposed vertically in parallel to each other or a state in which an angle formed by the first housing 101 and the second housing 111 is 0 degrees).

The support plate 169, for example, may have a rectangular shape, and may be disposed between the support cover 163 and the rail supports 164 to support the rail supports 164. According to an embodiment, the support plate 169 may support the constraint part 165 when the constraint part 165 moves as the second housing 111 rotates while facing one surface of the constraint part 165 disposed inside the rail supports 164 under the constraint part 165.

At least a portion of an upper surface of the multi-bar 123 in the axial direction of the hinge unit 120 may be flat and a plurality of columns stepped between a central portion and a peripheral portion of the multi-bar 123 may be mechanically coupled to each other. A rear surface of the display 130 may be seated in a central bottom part 23 of an upper surface (e.g., a surface in a direction in which the display 130 is disposed) of the multi-bar 123, and a peripheral part and the stepped part 21 of the multi-bar 123 may protect a side surface of the display 130 and guide a side surface of the display 130 when the display is slid.

As described above, when the first housing 101 and the second housing 111 perform a hinge operation, the electronic device 100 according to an embodiment of the present disclosure may support the second state (e.g., the unfolded state) more firmly based on the magnetic coupling or separation of the second magnet members 161 that form pairs.

Referring to FIG. 7, the multi-bar 123 may be provided such that the plurality of columns 123a are continuously connected to each other. A portion of an upper part of one column 123a of the multi-bar 123, for example, at least a portion of an upper end of the bottom part 23 of the multi-bar 123 may be formed flat, and stepped parts 21 that are higher than the bottom part 23 by a specific height may be disposed at opposite ends of the central portion of the multi-bar 123. A lower portion of the column 123a may include one or more bosses 25 extending downwards. The bosses 25 may be spaced apart from each other at a specific interval. Conic downward bosses, for example, triangular bosses 27 (or polygonal bosses) may be disposed in the stepped parts 21 of the opposite ends of the column 123a. The triangular bosses 27 may function as a shield such that the inside of the electronic device 100 is not observed from the outside while contacting (continuously contacting) the triangular bosses 27 of the adjacent columns.

Referring to FIG. 8, the column 123a may include one or more connection bosses 29 extending from one or more side walls of the bosses 25 at angles that are different from those of the bosses 25. The column 123a may include one or more boss recesses 28 disposed on a surface of the column 123a, which is opposite to a surface on which the bosses 25 having the connection bosses 29 are formed, and into which the connection bosses 29 may be inserted. The connection bosses of another column may be inserted into the boss recesses 28 or at least some of the connection bosses of another column may be extracted from the boss recesses 28 according to whether the electronic device 100 is folded.

Referring to FIG. 9, the multi-bar 123 in which a plurality of columns 123a are continuously disposed may include a groove 901 having a specific length as the above-described bosses 25 are continuously disposed with respect to a horizontal surface. The above-mentioned hinge bracket 162a may be inserted into the groove 901. The hinge bracket 162a inserted into the groove 901 may support the columns of the multi-bar 123 while moving along an inner wall of the groove 901 in correspondence to whether the electronic device 100 is folded or unfolded. Further, the shape of the multi-bar 123 may be maintained by fixing the columns 123a of the hinge bracket 162a such that the columns 123a are not separated. The groove 901 may have a specific shape (e.g., a T shape) such that the hinge bracket 162a is not easily separated after being inserted into the groove 901. In this regard, the hinge bracket 162a may have a shape (e.g., a T shape), an upper end of which has a width that is larger than that of a lower end thereof.

Referring to FIG. 10, the second housing 111 of the electronic device 100 may be connected to the hinge unit 120. In the hinge unit 120, for example, the plurality of columns 123a are continuously arranged, and the upper end surfaces of the columns 123a may be continuously disposed in correspondence to the unfolded state of the electronic device 100. Accordingly, lower ends of the columns 123a, a section of a lower end of which is smaller than that of an upper end thereof (for example, the section is triangular), may be disposed in a convexo-concave form as in state 1001. In order to surround a side surface of the multi-bar 123 having convexo-concave columns 123a, the hinge unit 120 may include a side cover 1010 as in state 1005. The side cover 1010 coupled to the hinge unit 120 may be inserted into the second housing 111 by a first width (e.g., a width inserted into the second housing 111 in a folded state) or by a second width (e.g., a width inserted into the second housing 111 in an unfolded state) according to the folded state or the unfolded state of the electronic device 100. An opposite side of the hinge unit 120, for example, may be connected to the housing 101. The hinge shaft 125 may be disposed on one side of the first housing 101. The hinge unit 120 may be rotated about the hinge shaft 125 inserted into the seating groove 167 while performing a hinge operation, and the second housing 111 connected to an end of the hinge unit 120 may be disposed at a specific angle according to rotation of the hinge unit 120. In this operation, the support cover 163 provided in the hinge unit 120 and the side cover 1010 supporting a side surface of the hinge unit 120 may performing a sliding operation to the inside of the second housing 111.

Figure 11:
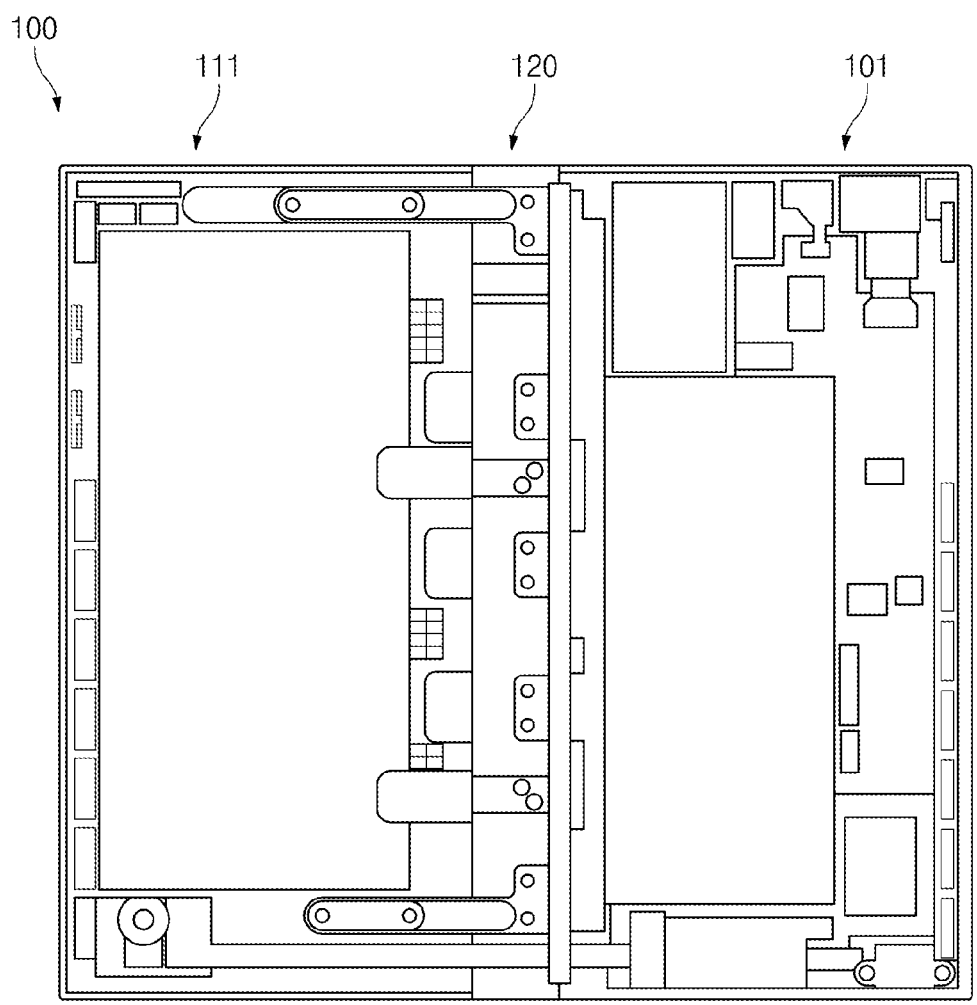
FIG. 11 is a view illustrating an example of a coupled state of an electronic device according to an embodiment of the present disclosure.

FIG. 11 is a view illustrating an example of a coupled state of an electronic device according to an embodiment of the present disclosure.

Figure 12A:
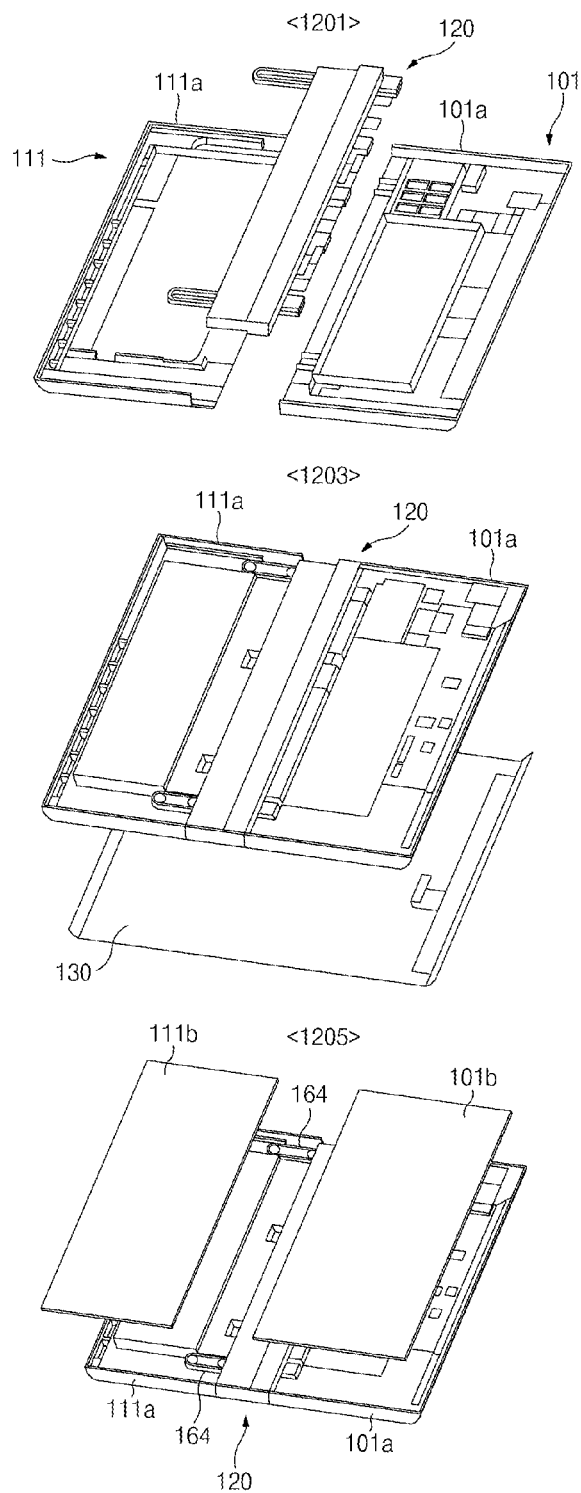
FIG. 12A is a view exemplifying a coupling sequence of an electronic device according to an embodiment of the present disclosure.

FIG. 12A is a view exemplifying a coupling sequence of an electronic device according to an embodiment of the present disclosure.

Referring to FIGS. 11 and 12A, as described above, the electronic device 100 may include a first housing 101, a second housing 111, and a hinge unit 120. The first housing 101 may be disposed such that the first display area of the display is exposed, and at least one device element related to driving of the electronic device 100 may be disposed. For example, the device element disposed inside the first housing 101, for example, may include at least one of a battery, a microphone, a camera, a memory, an SIM card, a first magnet member for coupling, a speaker, a connector, and an ear jack connector. The device element disposed inside the second housing 111, for example, may include an auxiliary battery, a vibration module, a magnet member for coupling, and a side button.

As in state 1201, in the above-described electronic device 100, the right side upper end cover 101a of the first housing 101 and the left side upper end cover 111a of the second housing 111 may be disposed in parallel to each other, and the hinge unit 120 may be coupled between the right side upper end cover 101a and the left side upper end cover 111a. Additionally, the above-described device elements disposed inside the first housing 101 may be disposed inside the right side upper end cover 101a, and the above-described device elements disposed inside the second housing 111 may be disposed inside the left side upper end cover 111a.

As in state 1203, the display 130 may be disposed on a front surface of the electronic device 100. In this regard, seating surfaces, on which the display 130 may be seated, may be disposed at central portions of the right side upper end cover 101a of the first housing 101 and the left side upper end cover 111a of the second housing 111. A surface of the hinge unit 120, on which the display 130 is positioned, may have a downwardly stepped shape, a specific area recess (e.g., areas of the bottom parts of the centers of the columns 123a) corresponding to the seating surface is lower than opposite ends thereof. As described above, one flexible display 130 (e.g., plastic OLED display (POLED)) may be disposed on the right side upper end cover 101a, a bottom part of the center of the upper end of the hinge unit 120, and the left side upper end cover 111a. The display 130 may be electrically connected to the main cover disposed inside the right side upper end cover 101a through a hole disposed on one side of the right side upper end cover 101a.

As in state 1205, the right side rear surface case 101b and the left side rear surface case 111b of the electronic device 100 may cover the rear surfaces of the right side upper end cover 101a and the left side upper end cover 111a. Then, the left side upper end cover 111a and the left side rear surface case 111b may be coupled to each other such that the rail supports 164 disposed in the hinge unit 120 may be slid.

Figure 12B:
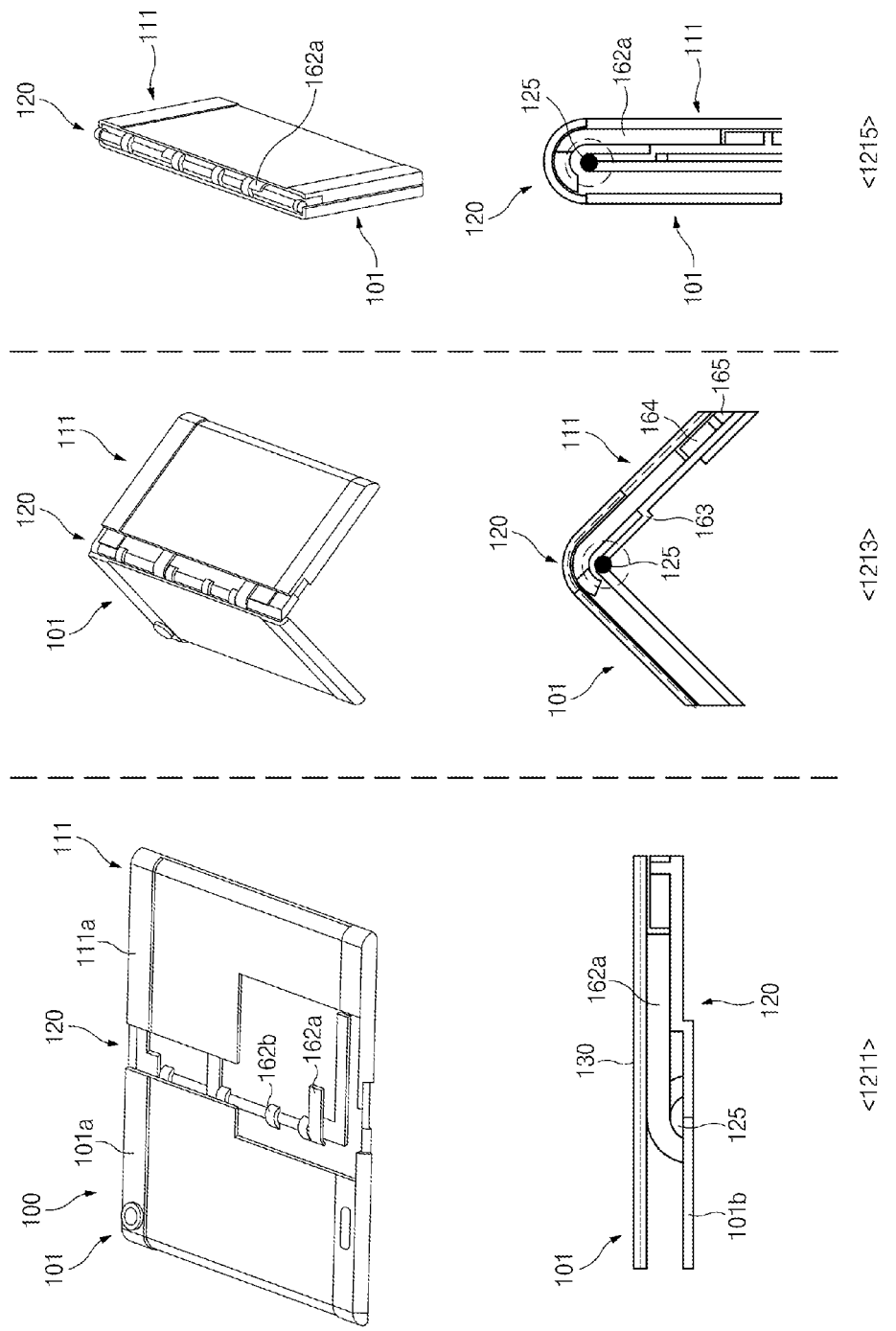
FIG. 12B is a view illustrating an example of a state of an internal structure during a hinge operation of an electronic device according to an embodiment of the present disclosure.

FIG. 12B is a view illustrating an example of a state of an internal structure during a hinge operation of an electronic device according to an embodiment of the present disclosure.

Referring to FIG. 12B, as in state 1211, the electronic device 100 may be in an unfolded state. The first housing 101, the second housing 111, and the hinge unit 120 of the electronic device 100 may be parallel to each other. In this operation, a flat area of the hinge bracket 162a may be disposed in parallel to the front surface of the first housing 101. The rotation guide 162b may support the unfolded state of the plate and the support cover.

The hinge shaft 125 may be disposed between the right side rear surface case 101b of the first housing 101 and the hinge unit 120. The hinge shaft 125 may have a semicircular section such that it does not protrude to the outside or a protrusion degree thereof is small, and the protruding portion of the hinge shaft 125 may be disposed from the right side rear surface case 101b toward the right side upper end cover 101a of the first housing 101. When the electronic device 100 is in an unfolded state, the multi-bar 123 may be disposed in a horizontal state. The drawing illustrates an area of a central portion of the display 130 is cut, for description of the hinge unit 120.

As in state 1213, the electronic device 100 may have a bent state in which the first housing 101 and the second housing 111 form a specific angle. In this state, the flat area of the hinge bracket 162a disposed in the hinge unit 120 may form a specific angle with an upper end surface of the second housing 111 while being disposed in parallel to the upper end surface of the second housing 111. While the electronic device 100 is in a bent state, at least a portion of the multi-bar 123 of the hinge unit 120 may be bent. Through the hinge operation of the hinge unit 120, the support cover 163 of the hinge unit 120 may be slid into the second housing 111. Further, the rail supports 164 of the hinge unit 120 may be slid along the constraint part 165 as an axis.

As in state 1215, the electronic device 100 may have a folded state in which the first housing 101 and the second housing 111 are disposed in parallel to each other. In this case, the rear surface of the first housing 101 may face the rear surface of the hinge unit 120 and the rear surface of the second housing 111 with respect to the hinge shaft 125. A flat area of the hinge bracket 162a may be disposed in parallel to the upper end surface of the first housing 101.

Figure 13:
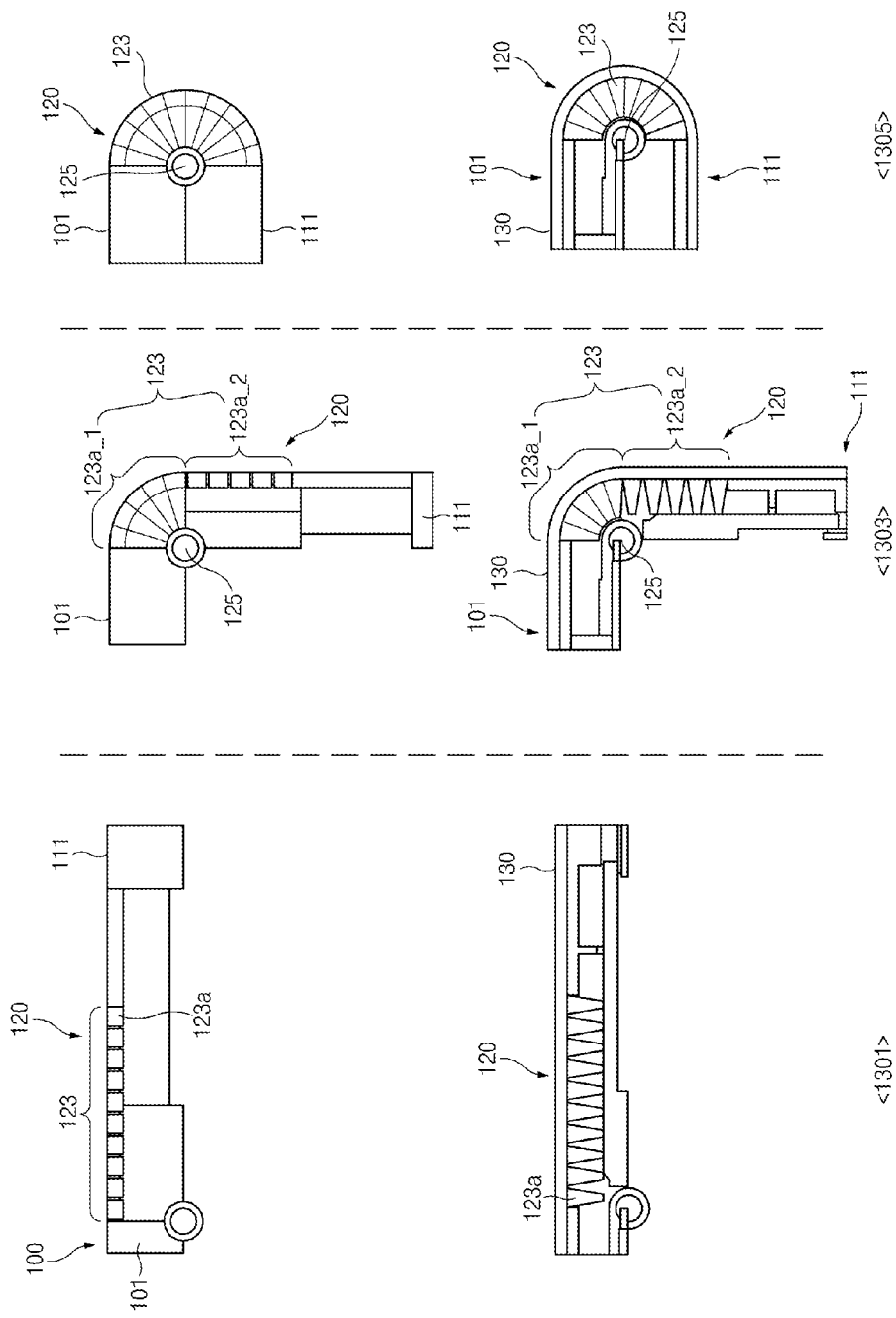
FIG. 13 is a view illustrating various examples of a hold state of an electronic device according to an embodiment of the present disclosure.

FIG. 13 is a view illustrating various examples of a hold state of an electronic device according to an embodiment of the present disclosure.

Figure 14:
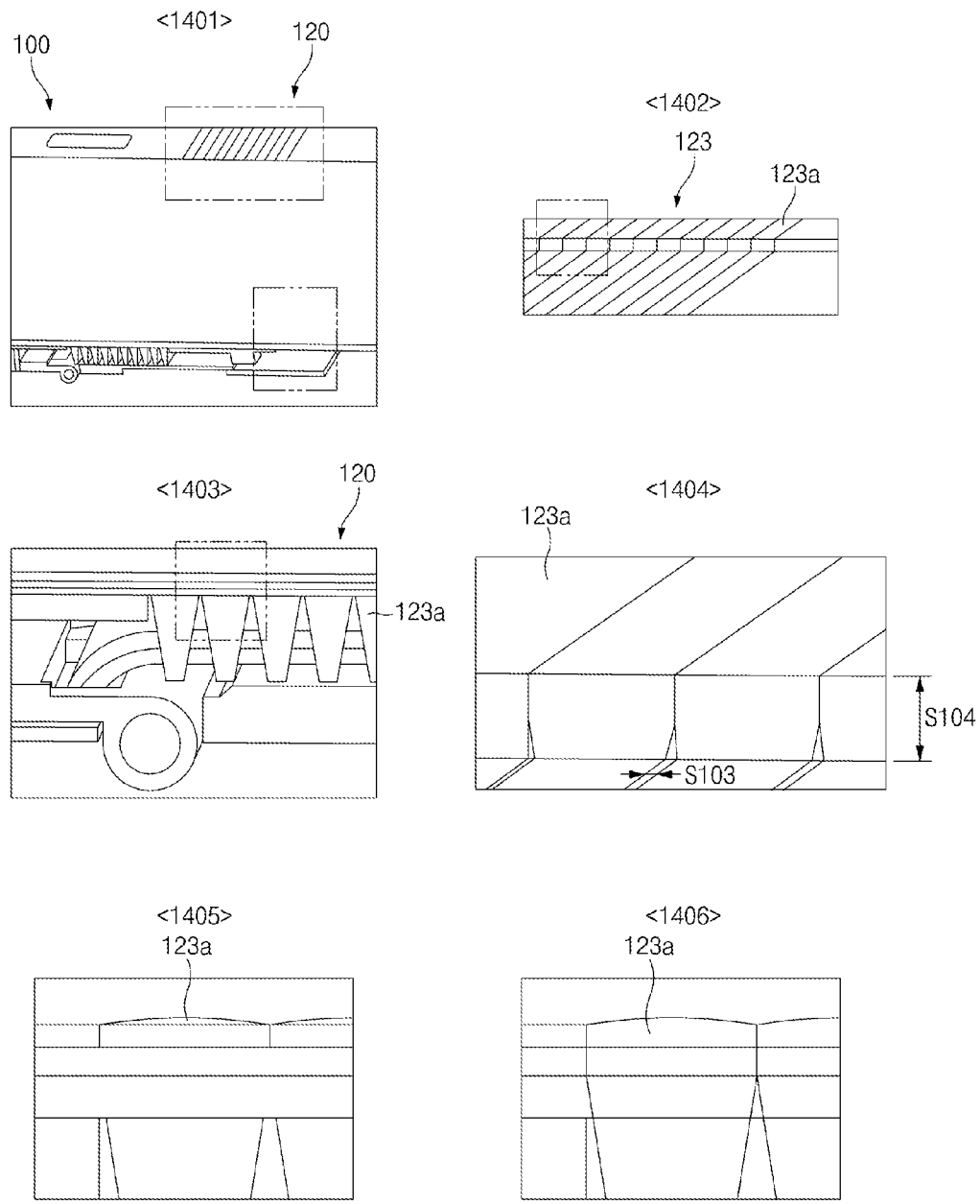
FIG. 14 is a view illustrating an example of a state of a hinge unit in an unfolded state of an electronic device according to an embodiment of the present disclosure.

FIG. 14 is a view illustrating an example of a state of a hinge unit in an unfolded state of an electronic device according to an embodiment of the present disclosure.

Figure 15:
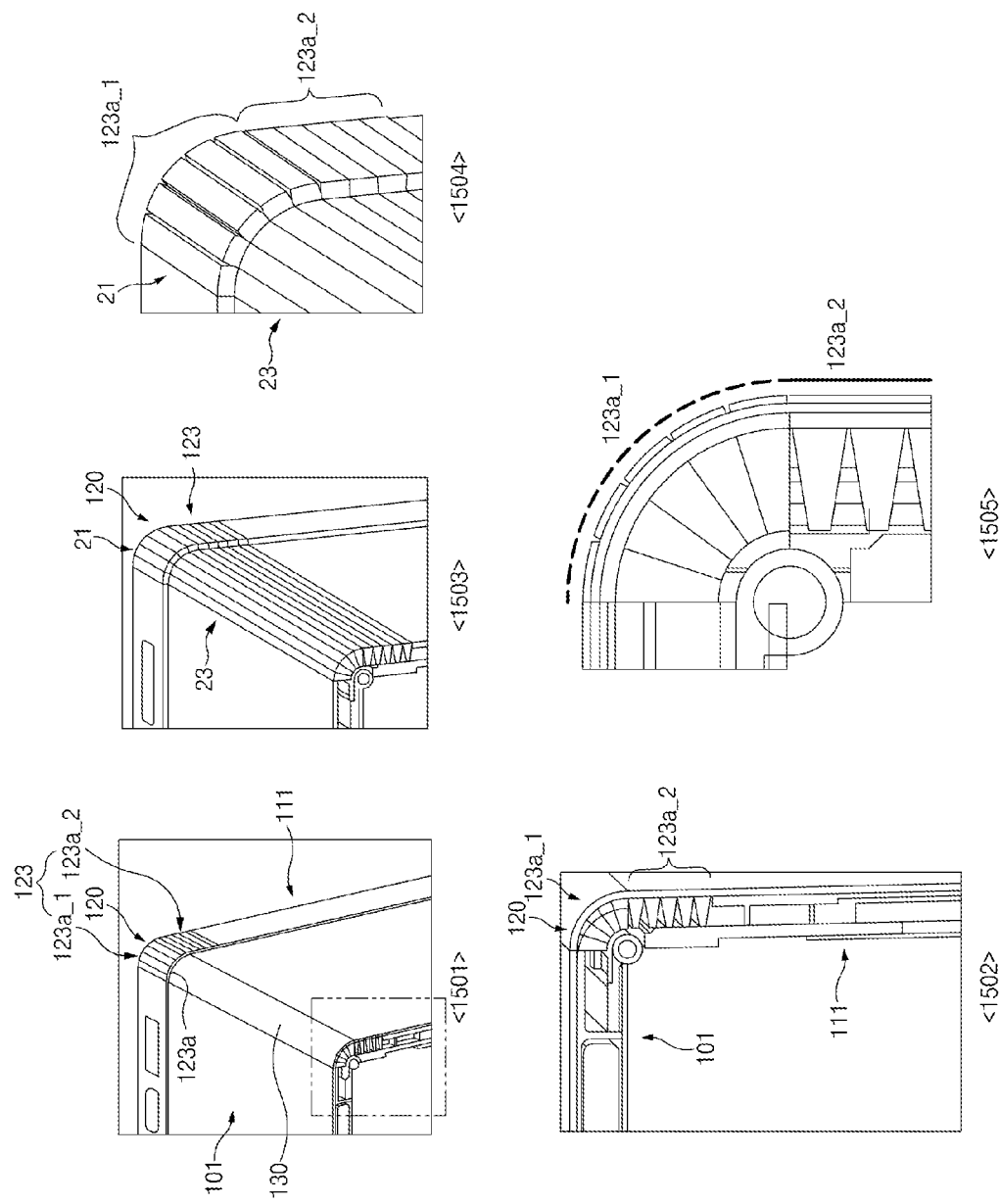
FIG. 15 is a view illustrating an example of a state of a hinge unit in a bent state of an electronic device according to an embodiment of the present disclosure.

FIG. 15 is a view illustrating an example of a state of a hinge unit in a bent state of an electronic device according to an embodiment of the present disclosure.

Figure 16:
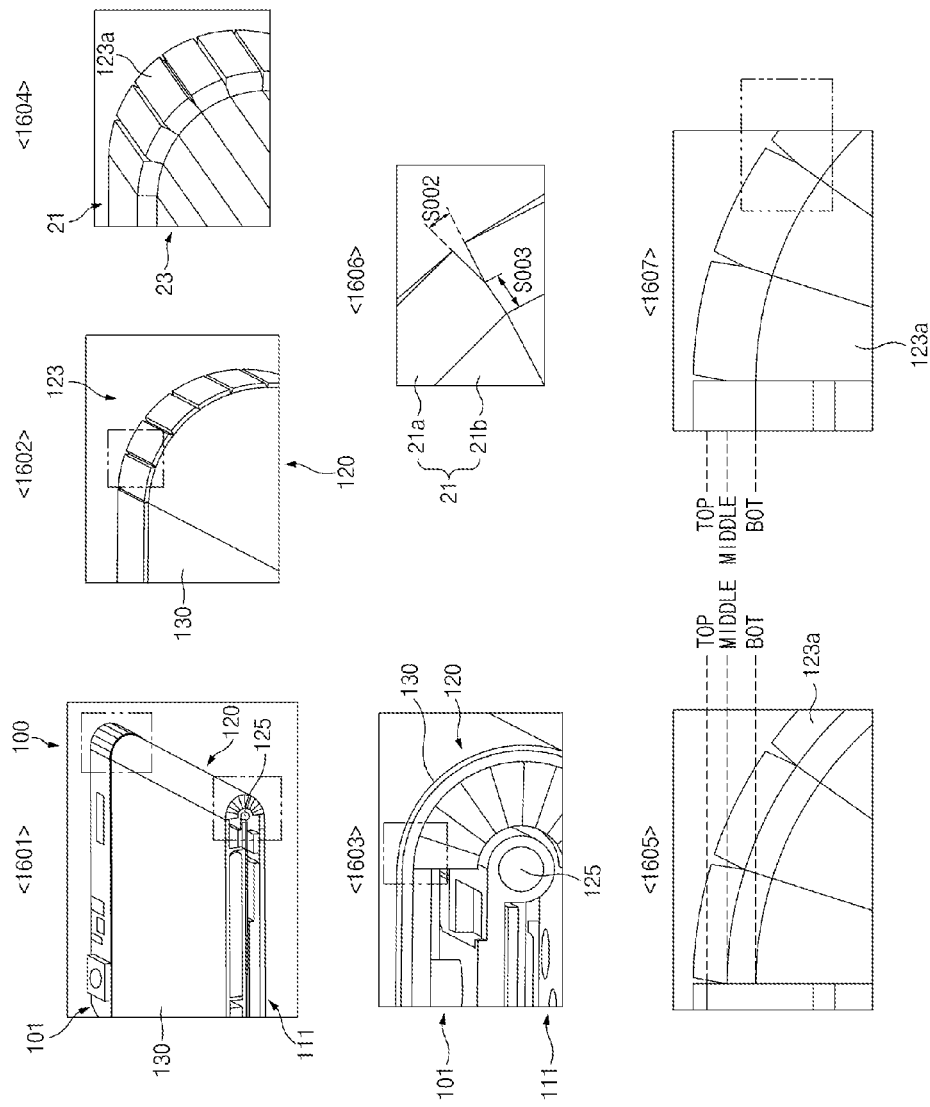
FIG. 16 is a view illustrating an example of a state of a hinge unit in a folded state of an electronic device according to an embodiment of the present disclosure.

FIG. 16 is a view illustrating an example of a state of a hinge unit in a folded state of an electronic device according to an embodiment of the present disclosure.

Referring to FIG. 13, as in state 1301, the electronic device 100 of the present disclosure may be in an unfolded state. The unfolded state may include a state in which the first housing 101, the hinge unit 120, and the second housing 111 are disposed in parallel to each other. Accordingly, as illustrated, in the multi-bar 123 of the hinge unit 120, upper surfaces of the columns 123a may contact upper surface of the adjacent columns. The upper end surface of the multi-bar 123 may be flat, and the display 130 may be disposed on the flat surface to be flat. While the upper surfaces of the columns 123a having an inverse triangular section is flat, a lower portion of the multi-bar 123 may be convexo-concave.

The electronic device 100 may be in a bent state as in state 1303. Although the drawing illustrates a state in which the first housing 101 and the second housing 111 form an angle of 90 degrees, the present disclosure is not limited thereto. As illustrated, while the first housing 101 and the second housing 111 form a specific angle, at least one bars of the multi-bar 123 of the hinge unit 120 are disposed such that there is no convexo-concave gap and the remaining bars of the multi-bar 123 may be disposed to maintain a convexo-concave gap. For example, in the bent state, lower sides of the first columns 123a_1 of the multi-bar 123 disposed in parallel to the second housing 111 may maintain a convexo-concave shape while the upper surfaces thereof are flat. The lower inclined edges of the second columns 123a_2 disposed in bent areas of the multi-bar 123 may face inclined edges of the adjacent columns. Accordingly, while the upper surfaces of the bars of the multi-bar 123 maintain a flat shape, the lower sides of the bars of the multi-bar 123 may be adjacent to each other or may gather together with respect to the hinge shaft 125. Accordingly, the display 130 may include an area disposed on the first housing 101 to be flat, an area disposed in the first housing 101 to be flat while forming a specific angle (e.g., the right angle), and a curved area (a shape of a ¼ arc of a circle) disposed on the hinge unit 120.

The electronic device 100 may be in a folded state as in state 1305. For example, a first housing 101 and a second housing 111 may be disposed in parallel to each other. Then, a rear surface of the first housing 101 and a rear surface of the second housing 111 may face each other. In this regard, the multi-bar 123 of the hinge unit 120 may be disposed in a semicircular shape (or at 180 degrees with respect to the hinge shaft 125). The multi-bar 123 disposed in a semicircular shape may have a state in which the lower inclined edges of the columns 123a contact or face the lower inclined edges of the adjacent columns. Further, the apexes of the columns 123a of the multi-bar 123 may gather in the hinge shaft 125. The display 130 may be disposed at an upper portion of the multi-bar to be deflected in correspondence to the bent shape of the multi-bar 123. Accordingly, the display 130 may include an area disposed on the first housing 101 to be flat, an area disposed in the first housing 101 to be flat while being disposed in parallel to the first housing 101, and a curved area (a shape of a semicircle of a circle) disposed on the hinge unit 120. It is noted that the columns 123a may have shapes other than a convexo-concave shape, and thus are not limited thereto. For example, the columns 123a may be cubic or cylindrical in shape, with or without hollow interiors, (not shown) if the columns 123a are made of a resiliently-compressible material that can be compressed in shape to, e.g., a convexo-concave shape, as the first housing 101 and/or the second housing 111 is/are rotated around the hinge shaft 125 similar to 123_1 in state 1303 illustrated in FIG. 13.

Referring to FIG. 14, as illustrated, the electronic device 100 may have a form in which the multi-bar 123 disposed in the hinge unit 120 is disposed to be flat. For example, when the electronic device 100 is in an unfolded state as in state 1401, the hinge unit 120 is disposed such that the plurality of columns 123a constituting the multi-bar 123 are parallel to each other while forming a flat surface and surface-contacting each other as in state 1402. According to an embodiment, as in state 1403, the lower sides of the columns 123a constituting the hinge unit 120 may have a saw-tooth shape (or a convexo-concave shape). As in state 1404, the upper sides of the columns 123a may have an upwardly stepped shape. As in state 1405 or state 1406, an aperture may not be generated between the stepped parts disposed at the outskirts of the columns 123a while being closely adjacent to the stepped parts of the adjacent columns. The bottom parts disposed inside the columns 123a may be disposed in parallel to the bottom parts of the adjacent columns, and may be disposed while having a specific interval (e.g., S103). The steps between the stepped parts and the bottom parts, for example, may have a height corresponding to the thickness (e.g., S104) of the display. Further, the height of the steps may have a value that is larger than the thickness of the display 130 to protect the display 130.

Referring to FIG. 15, as illustrated, the electronic device 100 may have a form in which the multi-bar 123 disposed in the hinge unit 120 has a specific bending angle (e.g., 30 to 120 degrees, for example, 90 degrees). According to an embodiment, as in state 1501 and state 1502, some first columns 123a_1 of the plurality of columns 123a constituting the multi-bar 123 of the hinge unit 120 disposed between the first housing 101 and the second housing 111 may be disposed to form curved surfaces and the remaining second columns 123a_2 may form flat surfaces. In an area having a curved surface, the display 130 may be in a bent state.

When the electronic device 100 is bent at a specific angle, as in states 1503, 1504, and 1505, the disposition state of the plurality of columns 123a constituting the multi-bar 123 may be changed. For example, the first column parts 123a_1 forming curved surfaces may be disposed to be adjacent to the other columns while having a specific interval between the stepped parts 21. The bottom parts 23 of the first columns 123a_1 forming curved surfaces may be disposed to closely contact the bottom parts of the adjacent columns such that no separate aperture is generated. The lower side walls of the first columns 123a_1 forming curved surfaces may be disposed to closely contact the lower side walls of the adjacent columns. The stepped parts 21 of the second columns 123a_2 forming flat surfaces may be disposed to be close to the stepped parts of the adjacent columns substantially without having no apertures. The bottom parts 23 of the second columns 123a_2 forming flat surfaces may be disposed in parallel to the bottom parts of the adjacent columns while having a specific gap with the bottom parts of the adjacent columns. As described in FIG. 14, the lower side walls of the second columns 123a_2 forming flat surfaces may be disposed while forming a saw-tooth shape (or a convexo-concave shape).

Referring to FIG. 16, as illustrated, the electronic device 100 may be disposed such that the first housing 101 and the second housing 111 are folded. For example, as in state 1601, state 1603, and state 1605, the upper ends of the plurality of columns 123a constituting the multi-bar 123 included in the hinge unit 120 may form curved surfaces (for example, semicircular surfaces). In this regard, the lower side walls of the columns 123a having an inverse-triangular section may be disposed while being closely adjacent to or contacting the lower side walls of the adjacent columns. The center lines of the columns 123a, for example, may face the center of the hinge shaft 125.

Further, as in state 1602, state 1604, state 1606, and state 1607, the stepped parts 21 of the plurality of columns 123a constituting the multi-bar 123 disposed in the hinge unit 120 may be widened while having a specific interval from the stepped parts of the adjacent columns. The bottom parts 23 of the columns 123a may closely contact the bottom parts of the adjacent columns. Then, as illustrated, each of the upper ends of the columns 123a may include an outer stepped portion 21a widened while forming a specific angle, and an inner stepped portion 21b having no aperture while closely contacting the adjacent columns. The outer stepped portions 21a and the inner stepped portions 21b are provided to separate the upper ends of the columns in view of meanings, and may be provided as a single body.

A location of a neutral surface of the display 130 may be determined in consideration of the thickness and material of the display 130, and the neutral surface may correspond to a specific range from the top surface to the bottom surface of the display 130. When the neutral surface is applied with reference to the bottom surface, the angle of area S002 increases while the size of area S003 becomes zero, and a design having no aperture (or a gap) in a part that supports the display 130 may be maintained even when the electronic device is completely spread. The size of area S003 increases to the corresponding surface and the size of area S002 decreases when the neutral surface is applied with reference to the top surface and the apertures of the bottom surfaces of the columns 123*a* supporting the display are present to a degree when the electronic device is spread, but the degree of the apertures of the bottom surfaces may become smaller to an ignorable degree because the thickness of the display 130 is small. When the central location is applied as the neutral surface, the apertures of the columns 123*a* supporting the display 130 is a specific distance (e.g., 0.1 mm) and the columns 123*a* exposed to the outside may surface-contact each other while having no aperture.

Figure 17:
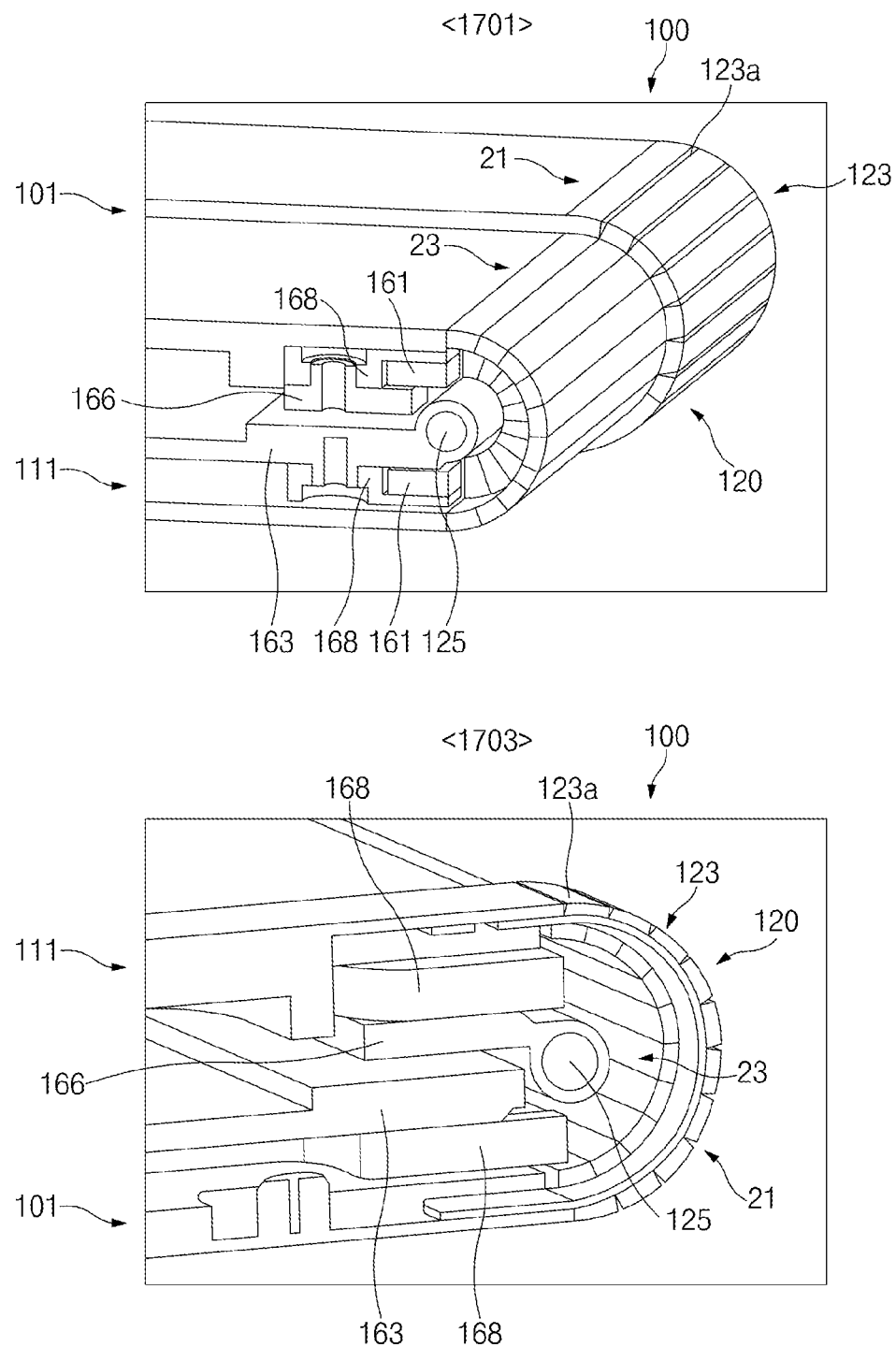
FIG. 17 is a view illustrating an example of an inside of a hinge unit in a folded state of an electronic device according to an embodiment of the present disclosure.

FIG. 17 is a view illustrating an example of an inside of a hinge unit in a folded state of an electronic device according to an embodiment of the present disclosure.

Referring to FIG. 17, as in state 1701 and state 1703, the hinge unit 120 of the electronic device 100 may be curved while the first housing 101 and the second housing 111 are disposed vertically in parallel to each other. In this regard, the stepped parts 21 of the columns 123*a* included in the multi-bar 123 of the hinge unit 120 may be spaced apart from the stepped parts of the adjacent columns by a specific interval. The bottom parts 23 of the columns 123*a* may closely contact the bottom parts of the adjacent columns, and the columns 123*a* may be disposed circularly as a whole. In this state, the columns 123*a* may form curved parts with respect to the hinge shaft 125. While the hinge unit 120 forms a curved portion, the second magnet members 161 forming pairs, which are disposed in the hinge unit 120, and the magnet support members 168 including the second magnet members 161 may be disposed vertically in parallel to each other. First ones of the second magnet members 161 forming pairs and the magnet support members 168 forming pairs may be disposed in the plate 166, and the other ones thereof may be disposed in the support cover 163.

According to various embodiments, the portable electronic device may include a first housing including a first surface and a second surface that is opposite to the first surface, a second housing including a third surface and a fourth surface that is opposite to the third surface, a hinge unit including a fifth surface and a sixth surface and connecting the first housing and the second housing, a flexible display disposed on the first surface, the fifth surface, and the third surface and a processor electrically connected to the flexible display and located in at least one of the first housing or the second housing, wherein the hinge unit is deflected around a hinge shaft extending in a first direction, wherein the hinge shaft extends along a border between the first housing and the second housing when viewed from the top of the first surface, wherein at least part of the first surface and at least part of the third surface are disposed in the same direction before the hinge unit is bent, and wherein at least part of the second surface and at least part of the fourth surface face each other when the hinge unit is bent at a specific angle, wherein the hinge unit includes a plurality of columns extending in the first direction and disposed on the fifth surface together.

According to various embodiments, at least one of the plurality of columns may include a top surface disposed at least a portion of the fifth surface, a bottom surface located in a direction of a sixth surface that is opposite to the top surface and a first side surface and a second side surface located between the top surface and the bottom surface, and wherein a width of at least one of the first side surface and the second side surface gradually decrease from the top surface toward the bottom surface of the column.

According to various embodiments, the hinge unit may include a first structure formed on the sixth surface, wherein the first structure includes a variable width that is perpendicular to the first direction, and wherein in a state in which the hinge unit is not bent, the variable width is longer than in a state in which the hinge unit is bent at a specific angle.

According to various embodiments, a first unit provided to be movable in a specific direction from the second housing or toward the second housing in reference to provision of the variable width.

According to various embodiments, the first unit may be slid to an opening formed in the second housing.

According to various embodiments, a portable electronic device may include a first housing including a first surface and a second surface that is opposite to the first surface, a second housing including a third surface and a fourth surface that is opposite to the third surface and a hinge unit connecting the first housing and the second housing and provided such that the fourth surface is rotated in a direction that faces the first surface, wherein the hinge unit includes a hinge shaft disposed at a periphery of one side of the first housing, a sliding unit at least a portion of which is slid to an inside or an outside of the second housing to be introduced or is slid from the inside or the outside of the second housing in a specific direction to be extracted in correspondence to a hinge operation of the second housing and a multi-bar disposed between the first surface and the fourth surface and including a plurality of multi-bar units to be spread or bent in correspondence to a hinge operation of the second housing.

According to various embodiments, a thickness of the first housing and a thickness of the second housing may be substantially the same or similar.

According to various embodiments, a width of the first housing and a width of the second housing may be substantially the same or similar.

According to various embodiments, a width of the first housing or a width of the second housing is larger than a width of the second housing or a width of the first housing by a specific size.

According to various embodiments, an auxiliary display disposed at a portion of the fourth surface of the second housing is exposed to the outside through the first housing and the second housing is folded at a specific angle.

According to various embodiments, the multi-bar may include a plurality of columns disposed in a direction of the hinge shaft.

According to various embodiments, the column may include a bottom part formed flat and a stepped part disposed at an upper end and a lower end of the bottom part and stepped to be higher than the bottom part.

According to various embodiments, the bottom parts of the plurality of columns form flat surfaces through closely surface-contacting the adjacent bottom parts while the first surface of the first housing and the third surface of the second housing are disposed in the same direction.

According to various embodiments, the bottom parts of the plurality of columns form curved portions through closely surface-contacting the adjacent bottom parts while the second surface of the first housing and the fourth surface of the second housing are disposed in the same direction.

According to various embodiments, the stepped parts of the plurality of columns form flat surfaces through closely surface-contacting the adjacent stepped parts while the first surface of the first housing and the third surface of the second housing are disposed in the same direction.

According to various embodiments, the stepped parts of the plurality of columns form curved portions through forming an aperture from the adjacent stepped parts while the second surface of the first housing and the fourth surface of the second housing face each other.

According to various embodiments, some of the plurality of columns form curved portions through contacting the adjacent columns while forming a specific angle within a range of an acute angle formed by the second surface of the first housing and the fourth surface of the second housing, and wherein the remaining columns form flat surfaces while contacting the adjacent column parts.

According to various embodiments, the stepped parts of the columns forming the curved portions are disposed while forming apertures of the stepped portions of the contacting columns, and wherein the stepped parts of the columns forming the flat surfaces are disposed to closely surface-contact the stepped parts of the contacting column parts.

According to various embodiments, the column may further include bosses extending downwards from peripheries of the stepped parts and widths of which gradually decrease as they go from the upper side to the lower side, and wherein at least some of the bosses disposed in the plurality of columns are disposed to surface-contact the side walls of the adjacent bosses while being bent in a range of an acute angle formed by the first housing and the second housing.

According to various embodiments, the hinge unit may include a plate fixed to the first housing, a support cover fixed to the second housing and a pair of magnet members fixed to the plate and the support cover, respectively, and wherein the magnet members are magnetically coupled to each other while the first surface of the first housing and the fourth surface of the second housing are disposed in the same direction.

According to various embodiments, the portable electronic device according to an embodiment includes a first housing including a first surface and a second surface that is opposite to the first surface, a second housing including a third surface and a fourth surface that is opposite to the third surface, and a hinge unit connecting the first housing and the second housing and provided such that the fourth surface of the second housing is rotated in a direction that faces the first surface of the first housing, the hinge unit includes a hinge shaft disposed on one side of the first housing to support a hinge operation of the second housing, and a plurality of columns disposed between the first housing and the second housing to form curved portions during a hinge operation, and the plurality of columns may be disposed on one side with respect to the hinge shaft while the first housing and the second housing are disposed vertically in parallel to each other.

According to various embodiments, the plurality of columns may be disposed in a semicircular shape with respect to the hinge shaft.

According to various embodiments, the plurality of columns may be disposed to be separated from the hinge shaft.

Figure 18:
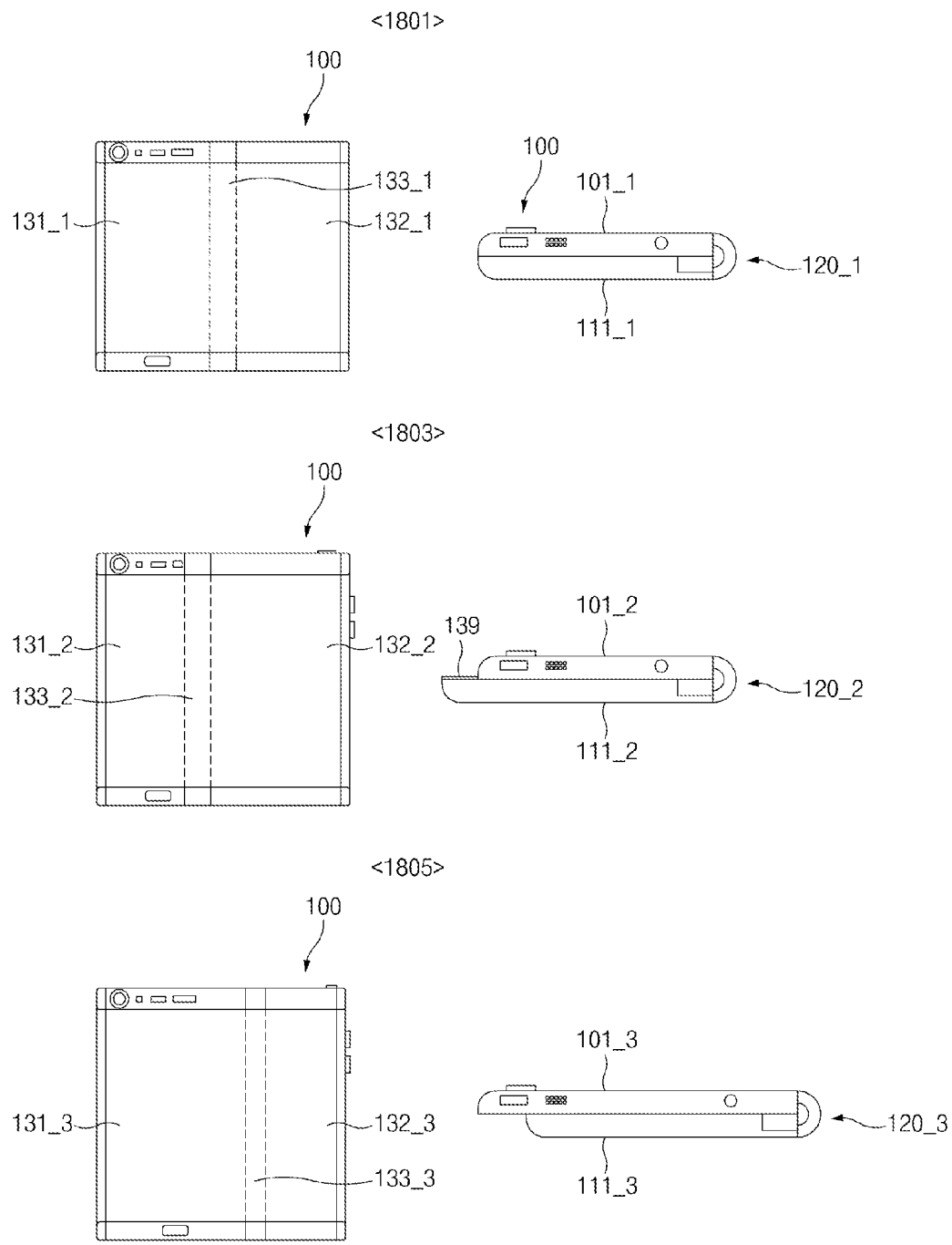
FIG. 18 is a view illustrating an example of various forms of an electronic device according to an embodiment of the present disclosure.

FIG. 18 is a view illustrating an example of various forms of an electronic device according to an embodiment of the present disclosure.

Referring to FIG. 18, in the electronic device, for example, a ratio of the first display area 131 and the second display area 132 may be a specific ratio (e.g., 5:5, 7:3, or 3:7).

As in state 1801, in the electronic device 100 according to an embodiment of the present disclosure, the sizes of the first display area 131_1 disposed in the first housing 101_1 and the second display area 132_1 disposed in the second housing 111_1 may be the same or similar. Accordingly, the first display area 131_1 and the second display area 132_1 may face each other while extending vertically at the same length while the hinge unit 120_1 forms a curved portion such that the electronic device 100 is in a folded state. A hinge display area 133_1 may be disposed between the first display area 131_1 and the second display area 132_1. The hinge display area 133_1 may be disposed on the hinge unit 120_1.

As in state 1803, in the electronic device 100 according to an embodiment of the present disclosure, the size of the first display area 131_2 disposed in the first housing 101_2 may be smaller than the second display area 132_2 disposed in the second housing 111_2. A hinge display area 133_2 disposed on the hinge unit 120_2 may be disposed between the first display area 131_2 and the second display area 133_2.

While the electronic device 100 is disposed in a folded state, at least a partial area of the second display area 132_2 may be exposed to the outside while the first display area 131_2 is positioned on the second display area 132_2. An auxiliary display 139, for example, may be disposed in a partial area of the second display area 132_2 exposed to the outside. For example, a physical key pressure sensor, a display touch sensor, and the like may be disposed in an area in which the auxiliary display 139 is disposed. A side key may be disposed at a side of the first housing 101_2 or a side of the second housing 111_2.

As in state 1805, in the electronic device 100 according to an embodiment of the present disclosure, the size of the first display area 131_3 disposed in the first housing 101_3 may be larger than the second display area 132_3 disposed in the second housing 111_3. In this case, a partial area of the first display area 131_3 may be exposed to the outside while the rear surface of the second display area 132_3 is positioned in a partial area of the rear surface of the first display area 131_3. A hinge display area 133_3 may be disposed on the hinge unit 120_3, between the first display area 131_3 and the second display area 132_3.

The flexible display device according to the present disclosure may secure a utility when being folded and a utility when being unfolded. In the flexible display device, the hinge unit 120 may absorb a displacement that is necessary during a folding operation or an unfolding operation of the first housing 101 and the second housing 111.

According to various embodiments, in the flexible display device, only the first display area 131 disposed in the first housing 101 or the second display area 132 disposed in the second housing 111 may be turned on in the folded state of the flexible display device. When a self-camera photographing function is performed, a display area (e.g., the first display area 131) of the flexible display device in a direction of the front surface of the flexible display device may be turned on. When a subject is photographed, in a folded state, the second display area 132 may be turned on or the first display area 131 and the second display area 132 may be turned on. During photographing by a camera, the hinge display area 133 disposed in an area of the hinge unit 120 may maintain a turn-off state.

When the state of the flexible display device is changed from a folded state to an unfolded state, the display 130 (e.g., the first display area 131, the second display area 132, and the hinge display area 133) may be automatically turned on. Further, when a portion of the flexible display device is folded at a specific angle, at least a portion of the display may be turned off (e.g., the entire display area may be turned off or the second display area 132 may be turned off).

As described above, according to various embodiments, the portability of the display may be maintained while the size of the display is enlarged. Further, according to various embodiments, the display areas may be used in various forms according to a folded state of the flexible display device, and a folding fatigue of the display, which occurs in a section that is folded by a hinge operation, may be improved.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A portable electronic device comprising:
   a first housing including a first surface and a second surface opposite to the first surface;
   a second housing including a third surface and a fourth surface opposite to the third surface;
   a hinge including a fifth surface and a sixth surface, the hinge connecting the first housing and the second housing;
   a flexible display disposed on the first surface, the fifth surface, and the third surface; and
   at least one processor electrically connected to the flexible display and located in at least one of the first housing or the second housing,
   wherein the hinge is configured to deflect around a hinge shaft extending in a first direction,
   wherein the hinge shaft extends along a border between the first housing and the second housing when viewed from a top of the first surface,
   wherein at least a part of the first surface and at least a part of the third surface are disposed in a same direction before the hinge is bent,
   wherein at least a part of the second surface and at least a part of the fourth surface face each other when the hinge is bent at a specific angle, and
   wherein the hinge includes a plurality of columns extending in the first direction and disposed on the fifth surface together.

2. The portable electronic device of claim 1, wherein at least one of the plurality of columns includes:
   a top surface disposed at a portion of the fifth surface;
   a bottom surface located in a direction of a sixth surface that is opposite to the top surface; and
   a first side surface and a second side surface located between the top surface and the bottom surface,
   wherein a width of at least one of the first side surface and the second side surface gradually decrease from the top surface toward the bottom surface of the plurality of columns.

3. The portable electronic device of claim 1,
   wherein the hinge includes a first structure formed on the sixth surface,
   wherein the first structure includes a variable width that is perpendicular to the first direction, and
   wherein, in a state in which the hinge is not bent, the variable width is longer than in a state in which the hinge is bent at a specific angle.

4. The portable electronic device of claim 3, wherein the first structure includes:
   a first unit provided to be movable in a specific direction from the second housing or toward the second housing in reference to provision of the variable width.

5. The portable electronic device of claim 4, wherein the first unit is slid to an opening formed in the second housing.

6. A portable electronic device comprising:
   a first housing including a first surface and a second surface that is opposite to the first surface;
   a second housing including a third surface and a fourth surface that is opposite to the third surface; and
   a hinge connecting the first housing and the second housing and provided such that the fourth surface is rotated in a direction that faces the first surface, wherein the hinge includes:
   a hinge shaft disposed at a periphery of one side of the first housing, and
   a sliding device including a portion that is configured to:
   slide to an inside or an outside of the second housing to be introduced, or
   slide from the inside or the outside of the second housing in a specific direction to be extracted in correspondence to a hinge operation of the second housing; and
   a multi-bar disposed between the first surface and the fourth surface and including a plurality of multi-bar units to be spread or bent in correspondence to a hinge operation of the second housing.

7. The portable electronic device of claim 6, wherein a thickness of the first housing and a thickness of the second housing are substantially the same or similar.

8. The portable electronic device of claim 6, wherein a width of the first housing and a width of the second housing are substantially the same or similar.

9. The portable electronic device of claim 6, wherein a width of the first housing or a width of the second housing is larger than a width of the second housing or a width of the first housing by a specific size.

10. The portable electronic device of claim 9, further comprising:
    an auxiliary display,
    wherein the auxiliary display is configured to be:
    disposed at a portion of the fourth surface of the second housing, and
    exposed to the outside while the first housing and the second housing is folded at a specific angle.

11. The portable electronic device of claim 6, wherein the multi-bar includes:
    a plurality of columns disposed in a direction of the hinge shaft.

12. The portable electronic device of claim 11,
    wherein each of the plurality of columns includes:
    a bottom part formed flat, and
    a stepped part disposed at an upper end and a lower end of the bottom part, and
    wherein the stepped part is configured to be stepped to be higher than the bottom part.

13. The portable electronic device of claim 12, wherein the bottom parts of the plurality of columns form flat surfaces by closely contacting the surfaces of adjacent bottom parts while the first surface of the first housing and the third surface of the second housing are disposed in a same direction.

14. The portable electronic device of claim 12, wherein the bottom parts of the plurality of columns form curved portions through by closely contacting the surfaces of adjacent bottom parts while the second surface of the first housing and the fourth surface of the second housing are disposed in a same direction.

15. The portable electronic device of claim 12, wherein the stepped parts of the plurality of columns form flat surfaces by closely contacting the surfaces of adjacent stepped parts while the first surface of the first housing and the third surface of the second housing are disposed in a same direction.

16. The portable electronic device of claim 12, wherein the stepped parts of the plurality of columns form curved portions by forming an aperture from the adjacent stepped parts while the second surface of the first housing and the fourth surface of the second housing face each other.

17. The portable electronic device of claim 12,
    wherein at least some of the plurality of columns form curved portions by contacting the adjacent columns while forming a specific angle within a range of an acute angle formed by the second surface of the first housing and the fourth surface of the second housing, and
    wherein the remaining columns form flat surfaces while contacting the adjacent column parts.

18. The portable electronic device of claim 17,
    wherein the stepped parts of the columns forming the curved portions are formed while apertures of the stepped portions of the contacting columns are formed, and
    wherein the stepped parts of the columns forming the flat surfaces are configured to closely contact surfaces of the stepped parts of the contacting column parts.

19. The portable electronic device of claim 12,
    wherein the column further includes a plurality of bosses extending downwards from peripheries of the stepped parts, widths of the plurality of bosses gradually decreases as they extend from the upper side to the lower side, and
    wherein at least some of the plurality of bosses disposed in the plurality of columns are disposed to contact surfaces of the side walls of the adjacent bosses while being bent in a range of an acute angle formed by the first housing and the second housing.

20. The portable electronic device of claim 6, wherein the hinge includes:
    a plate fixed to the first housing;
    a support cover fixed to the second housing; and
    a pair of magnet members fixed to the plate and the support cover, respectively, and
    wherein the magnet members are magnetically coupled to each other while the first surface of the first housing and the fourth surface of the second housing are configured in a same direction.

21. The portable electronic device of claim 6,
    wherein the multi-bar includes a plurality of multi-bar units,
    wherein, when the first housing and the second housing are substantially level with one another, gaps are formed between adjacent ones of the plurality of multi-bar units, and
    wherein, when at least one of the first housing or the second housing is rotated around the hinge, a size of the gap between at least two adjacent ones of the plurality of multi-bar units is changed.

22. The portable electronic device of claim 6,
    wherein the multi-bar includes a plurality of multi-bar units that is resiliently compressible, and
    wherein, when at least one of the first housing or the second housing is rotated around the hinge, at least two adjacent ones of the plurality of multi-bar units are compressed against one another.

\* \* \* \* \*